(12) United States Patent
Nara

(10) Patent No.: US 8,917,378 B2
(45) Date of Patent: Dec. 23, 2014

(54) EXPOSURE METHOD, EXPOSURE APPARATUS, AND METHOD FOR PRODUCING DEVICE WITH PLURALITY OF PROJECTION OPTICAL SYSTEMS AND PATTERN HAVING FIRST PARTIAL PATTERN AREA AND SECOND PARTIAL AREA HAVING OVERLAID AREA WITH FIRST PARTIAL PATTERN AREA

(75) Inventor: Kei Nara, Yokohama (JP)

(73) Assignee: Nikon Corporation, Tokyo (JP)

( * ) Notice: Subject to any disclaimer, the term of this patent is extended or adjusted under 35 U.S.C. 154(b) by 1142 days.

(21) Appl. No.: 12/261,741

(22) Filed: Oct. 30, 2008

(65) Prior Publication Data

US 2009/0257033 A1    Oct. 15, 2009

Related U.S. Application Data

(60) Provisional application No. 61/008,336, filed on Dec. 20, 2007.

(51) Int. Cl.
*G03B 27/54* (2006.01)
*G03F 7/20* (2006.01)

(52) U.S. Cl.
CPC ........ *G03F 7/70791* (2013.01); *G03F 7/70275* (2013.01)
USPC .......................................................... 355/67

(58) Field of Classification Search
CPC ................................................. G03F 7/70275
USPC ..................................................... 355/67, 53
See application file for complete search history.

(56) References Cited

U.S. PATENT DOCUMENTS

| | | | |
|---|---|---|---|
| 6,512,573 B2 | 1/2003 | Fürter | |
| 6,795,169 B2 * | 9/2004 | Tanaka et al. | 355/67 |
| 2008/0013061 A1 | 1/2008 | Kato | |
| 2009/0021712 A1 | 1/2009 | Kumazawa et al. | |
| 2010/0315611 A1 | 12/2010 | Kato | |

FOREIGN PATENT DOCUMENTS

| | | |
|---|---|---|
| DE | 197 57 074 A1 | 6/1999 |
| EP | 1 986 220 A1 | 10/2008 |
| JP | 11-265848 | 9/1999 |

(Continued)

OTHER PUBLICATIONS

Office Action from corresponding European Patent Application No. 08865814.1 dated Jan. 24, 2011.

(Continued)

*Primary Examiner* — Chia-how Michael Liu
(74) *Attorney, Agent, or Firm* — Finnegan, Henderson, Farabow, Garrett & Dunner, LLP

(57) ABSTRACT

A method for exposing a substrate includes arranging, in a direction, pattern areas to projection systems respectively arranged at an interval and each having a magnifying magnification, the pattern areas having area widths each smaller than the interval and greater than a width obtained by dividing an exposure width of the projection system by the magnifying magnification; and successively transferring onto the substrate an image, projected by an associated projection system, of a first pattern provided in a first partial pattern area in each pattern area and an image, projected by the associated projection system, of a second pattern provided in a second partial pattern area in each pattern area and having at least a partial area different from the first partial pattern area in the direction in each pattern area. The occurrence of any stitch error is suppressed and the transfer accuracy is improved.

30 Claims, 14 Drawing Sheets

(56) References Cited

FOREIGN PATENT DOCUMENTS

| TW | 2007-32868 | 1/2014 |
|---|---|---|
| WO | WO 2007/094235 A1 | 6/2007 |
| WO | WO 2007/094198 A1 | 8/2007 |

OTHER PUBLICATIONS

International Search Report and Written Opinion for International Application No. PCT/JP2008/07118, dated Feb. 27, 2009.

PCT International Preliminary Report on Patentability for International Application No. PCT/JP2008/071188, dated Jun. 22, 2010 (7 pgs.).

Office Action for European Patent Application No. 08865814.1, dated Apr. 26, 2012.

Notice of Reasons for Rejection of Japanese patent application No. 2008-309172 dated Dec. 12, 2012.

International Preliminary Report on Patentability, The International Bureau of WIPO, issued Jun. 22, 2010, pp. 1-7.

First Official Letter of State Intellectual Property Office of P. R. China dated Mar. 31, 2014 in Application No. 201210359535.9.

Preliminary Examination Report and Search Report dated Dec. 27, 2013 of Taiwan Application No. 97149567.

* cited by examiner

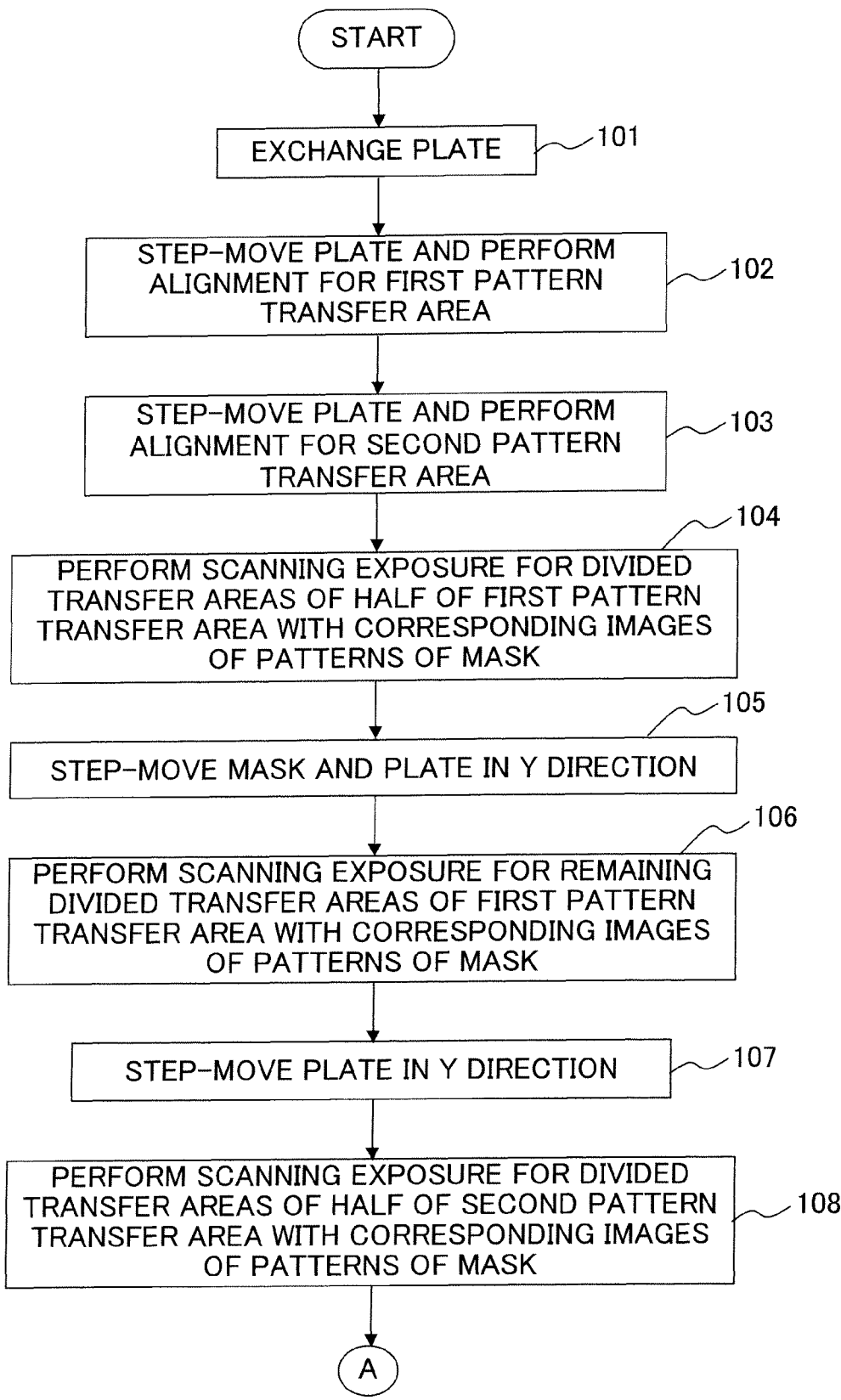

EXPOSURE METHOD, EXPOSURE APPARATUS, AND METHOD FOR PRODUCING DEVICE WITH PLURALITY OF PROJECTION OPTICAL SYSTEMS AND PATTERN HAVING FIRST PARTIAL PATTERN AREA AND SECOND PARTIAL AREA HAVING OVERLAID AREA WITH FIRST PARTIAL PATTERN AREA

This application claims the benefit of U.S. Provisional Application No. 61/008,336, filed on Dec. 20, 2007.

BACKGROUND OF THE INVENTION

1. Field of the Invention

The present invention relates to an exposure technique for forming a projected image of a pattern on a substrate, and a technique for producing a device using the exposure technique.

2. Description of the Related Art

For example, when a device such as a semiconductor element or a liquid crystal display element (electronic device, microdevice) is produced, a projection exposure apparatus is used, which projects a pattern of a mask (reticle, photomask, etc.), via a projection optical system, onto a plate (glass plate or semiconductor wafer, etc.) coated with a resist. For example, a plate for producing the liquid crystal display element is increasingly large-sized. In recent years, a plate exceeding 2 m square is used. For example, if a projection optical system of 1× magnification is used for such a plate, the mask is large-sized as well. As the mask is more large-sized, the cost of the mask becomes higher, because the production steps are more complicated for large areal sizes, while it is also necessary to maintain the flatness of the mask substrate. Further, for example, in order to form a thin film transistor portion of the liquid crystal display element, it is necessary to use masks in an amount corresponding to four to five layers in ordinary cases, which requires an enormous cost.

In view of the above, for example, a scanning type projection exposure apparatus (scanning type exposure apparatus) has been suggested, wherein a pattern of the mask is made to be small-sized as compared with the plate, by using a magnifying multilens system including a plurality of partial projection optical systems which are arranged in a divided manner in two arrays in the scanning direction, which are arranged adjacently in a direction perpendicular to the scanning direction (hereinafter referred to as "non-scanning direction"), and each of which has a magnifying magnification (see, for example, Japanese Patent Application Laid-open No. 11-265848). In the conventional scanning type exposure apparatus provided with the magnifying multilens system, the pattern of the mask is divided into a plurality of pattern areas in a strip-shaped form (stripped form) corresponding to the partial projection optical systems, respectively. Projected images of patterns in the respective pattern areas are transferred onto the plate, while being stitched with each other in the non-scanning direction, by one time of the scanning exposure. The phrase "transferred while being stitched with each other" means that the boundary portions in the non-scanning direction of the adjacent pattern projected images are transferred while being overlaid with each other.

SUMMARY OF THE INVENTION

However, in the case of the scanning type exposure apparatus provided with the magnifying multilens system as described above, it is feared that an error of stitch (hereinafter referred to as "stitch error"), which is caused, for example, due to a drawing error of the pattern generated between the respective pattern areas on the mask, might arise between the respective projected images transferred onto the plate while being stitched with each other.

Taking the foregoing circumstances into consideration, an object of the present invention is to provide an exposure method, an exposure apparatus, and a method for producing a device, wherein it is possible to suppress the occurrence of the stitch error when a magnified image of a pattern is formed on a plate (substrate) by using a plurality of projection optical systems (partial projection optical systems).

According to a first aspect of the present invention, there is provided an exposure method comprising: a pattern-arranging step of arranging, in a predetermined direction, pattern areas with respect to projection optical systems, respectively, which are arranged at an interval and each of which has a magnifying magnification, the pattern areas having area widths each of which is smaller than the interval of the projection optical systems and greater than a width obtained by dividing an exposure width of one of the projection optical systems by the magnifying magnification; and an exposure step of successively transferring onto a substrate a projected image, projected by an associated projection optical system among the projection optical systems, of a first pattern provided in a first partial pattern area in each of the pattern areas and a projected image, projected by the associated projection optical system, of a second pattern provided in a second partial pattern area in each of the pattern areas, the second partial pattern area having at least a partial area different from the first partial pattern area in the predetermined direction in each of the pattern areas.

According to a second aspect of the present invention, there is provided an exposure apparatus comprising: a plurality of projection optical systems which are arranged at an interval and each of which has a magnifying magnification; a pattern-arranging mechanism which arranges, in a predetermined direction, pattern areas with respect to the plurality of projection optical systems, respectively and which moves the pattern areas in the predetermined direction, the pattern areas having area widths each of which is smaller than the interval of the projection optical systems and greater than a width obtained by dividing an exposure width of one of the projection optical systems by the magnifying magnification; a substrate-holding mechanism which holds a substrate and which moves the substrate in the predetermined direction; and a controller which performs control to successively transfer onto the substrate a projected image, projected by an associated projection optical system among the projection optical systems, of a first pattern provided in a first partial pattern area in each of the pattern areas and a projected image, projected by the associated projection optical system, of a second pattern provided in a second partial pattern area in each of the pattern areas, the second partial pattern area having at least a partial area different from the first partial pattern area in the predetermined direction in each of the pattern areas.

According to a third aspect of the present invention, there is provided a method for producing a device, comprising: an exposure step of using the exposure apparatus as defined above to transfer onto a photosensitive substrate a projected image, projected by the projection optical systems, of a pattern provided in the pattern areas; a developing step of developing the photosensitive substrate onto which the projected image has been transferred to form, on the photosensitive substrate, a transfer pattern layer having a shape corresponding to the projected image; and a processing step of processing the photosensitive substrate via the transfer pattern layer.

According to the exposure method, the exposure apparatus, and the method for producing the device of the present invention, it is possible to suppress the occurrence of the stitch error in a case that a magnified image of the pattern is formed on a plate (substrate) by using the plurality of projection optical systems (partial projection optical systems), thus making it possible to improve the transfer accuracy of the projected image of the entire pattern.

DESCRIPTION OF THE PREFERRED EMBODIMENTS

An exemplary preferred embodiment of the present invention will be explained below with reference to FIGS. 1 to 12 by way of example.

Figure 1:
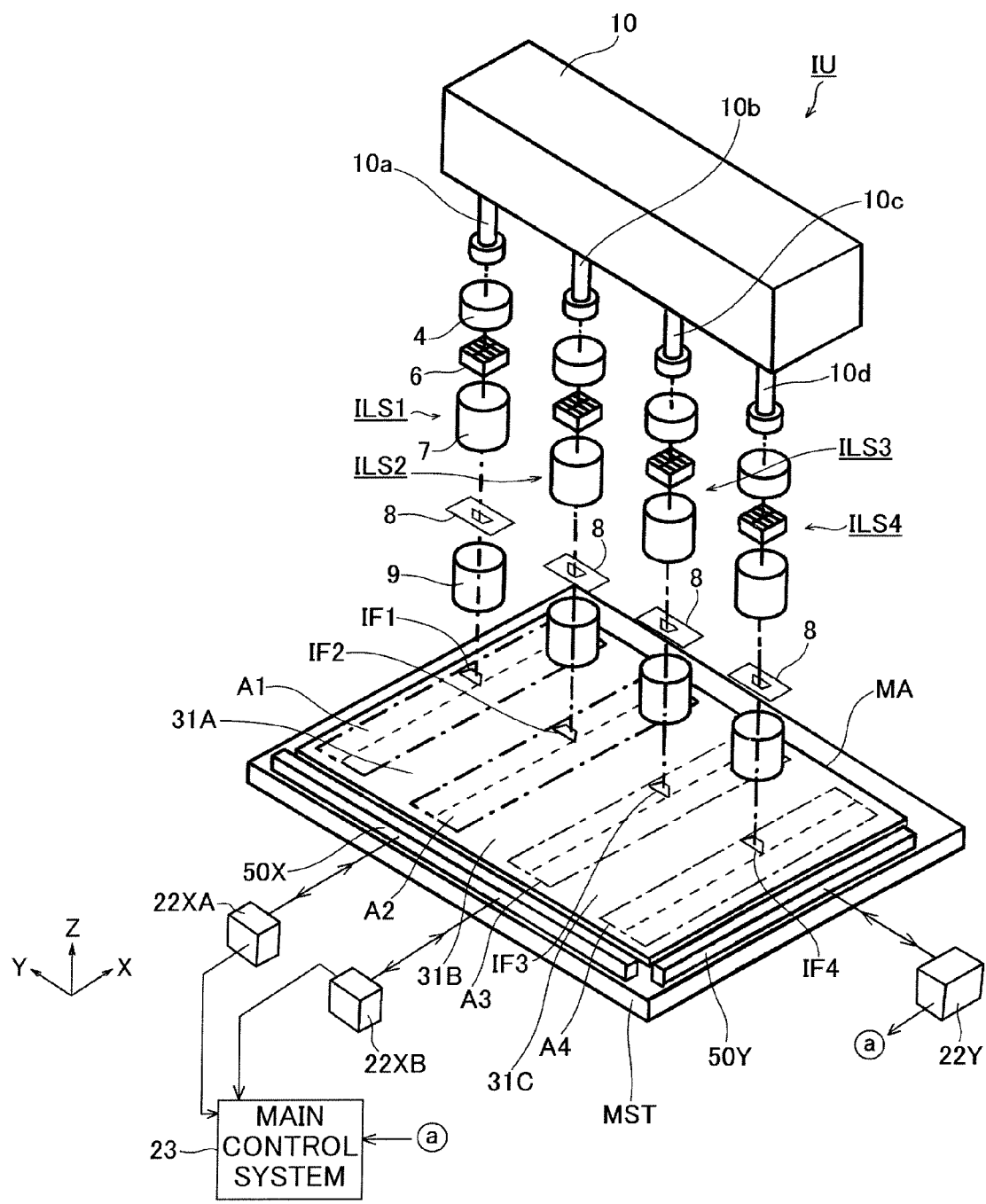
FIG. 1 shows a perspective view of an illumination device and a mask stage of an exemplary exposure apparatus of an embodiment of the present invention.
Figure 2:
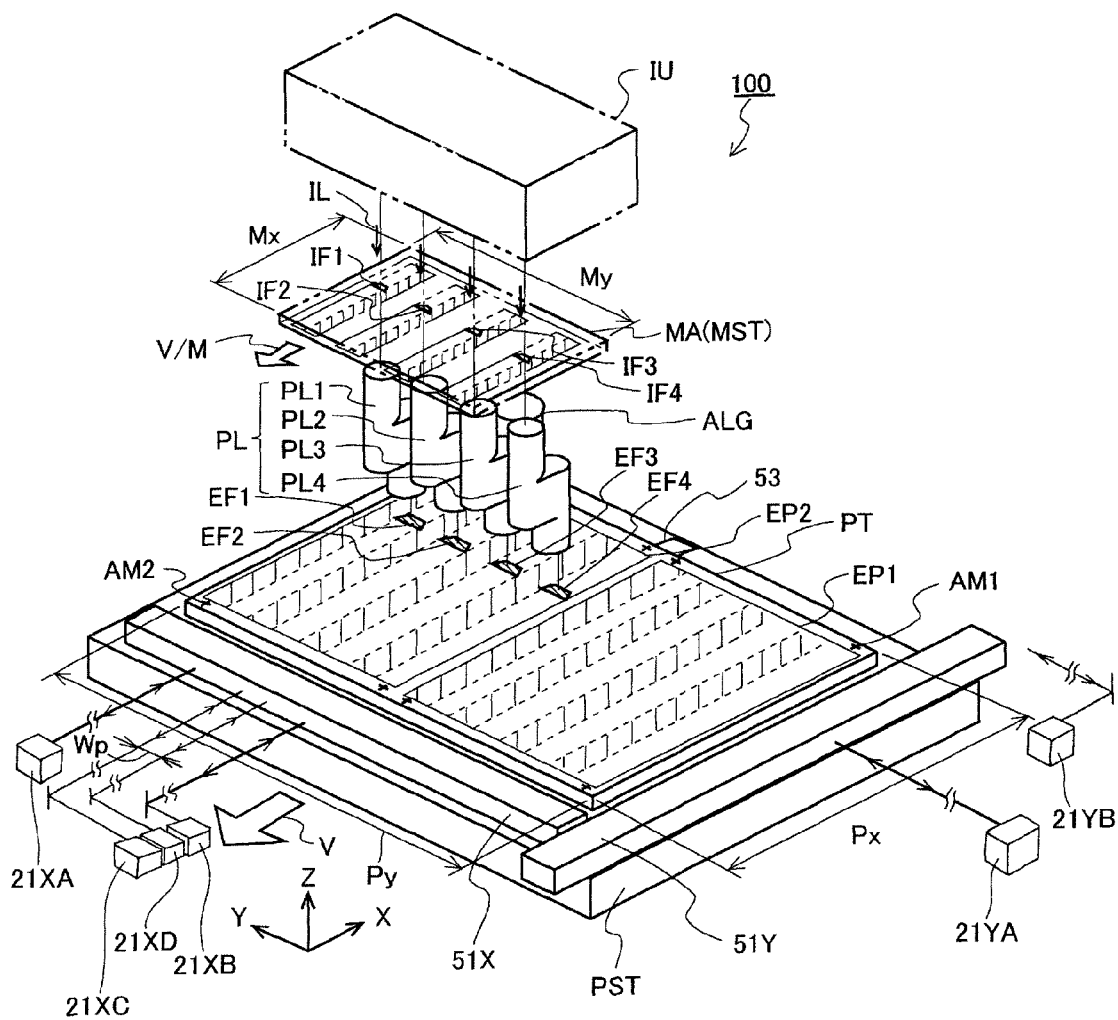
FIG. 2 shows a perspective view of a schematic construction of the exemplary exposure apparatus of the embodiment of the present invention.

FIG. 2 shows a perspective view of a schematic construction of an exposure apparatus 100 constructed of a scanning type projection exposure apparatus of this embodiment which is of the step-and-scan system. FIG. 1 shows a perspective view of a schematic construction of a mask stage and an illumination device of the exposure apparatus 100. With reference to FIGS. 1 and 2, the exposure apparatus 100 includes an illumination device IU which illuminates a pattern of a mask MA with an illumination light beam from a light source; a mask stage MST which is movable while holding the mask MA; a projection optical device PL which projects a magnified image of the pattern of the mask MA onto a plate (substrate) PT; a substrate stage PST which is movable while holding the plate PT; a driving mechanism (not shown) which includes, for example, linear motors for driving the mask stage MST and the substrate stage PST; a main control system 23 which integrally controls the operation of the driving mechanism, etc.; and the like. The illumination device IU, base members (not shown) of the mask stage MST and the substrate stage PST, the projection optical device PL, etc. are supported by an unillustrated frame mechanism.

The plate PT of this embodiment is, as an example, a rectangular flat plate-shaped glass plate of about 1.9×2.2 m square, 2.2×2.4 m square, 2.4×2.8 m square, or 2.8×3.2 m square coated with a photoresist (photosensitive material) for producing a liquid crystal display element. As an example, as shown in FIG. 2, a surface of the plate PT is recognized by the main control system 23 while being comparted into two pattern transfer areas EP1, EP2 to each of which the pattern of the mask MA is transferred.

The following description will be made with reference to FIGS. 1 and 2 assuming that the Z axis extends perpendicularly to a guide surface (not shown) of the mask stage MST, the X axis extends in the scanning direction of the mask MA during the scanning exposure in a plane parallel to the guide surface, and the Y axis extends in the non-scanning direction perpendicular to the X axis. In this embodiment, a guide surface (not shown) of the substrate stage PST is parallel to the guide surface of the mask stage MST; and the scanning direction of the plate PT during the scanning exposure is parallel to the X axis. The direction of rotation about the axis parallel to the Z axis is referred to as "θZ direction" as well.

Illumination light or illumination light beams (exposure light) for the exposure, which are emitted from four light-feeding portions 10a, 10b, 10c, 10d of a light source section 10 of the illumination device IU shown in FIG. 1, are allowed to come into four partial illumination optical systems ILS1, ILS2, ILS3, ILS4, respectively, which are constructed identically and which partially illuminate the mask MA. A pulse light beam, which is composed of the 3× high harmonic wave of the YAG laser (wavelength: 355 nm), is used as the illumination light beam for the exposure. Those usable as the illumination light beam for the exposure also include, for example, a light beam having a wavelength selected from the wavelength region including light beams of g-ray (wavelength: 436 nm), h-ray (wavelength: 405 nm), and i-ray (wavelength: 365 nm) radiated from a ultrahigh voltage mercury lamp, an excimer laser light beam including, for example, KrF (wavelength: 248 nm) and ArF (wavelength: 193 nm); etc.

The illumination light beams, which are emitted from the light-feeding portions 10a to 10d, are allowed to come into the partial illumination optical systems ILS1 to ILS4 respectively; and the illumination light beams are converted into parallel light fluxes by collimator lenses 4, and are allowed to come into fly's eye lenses 6 which serve as optical integrators. The illumination light beams, from a large number of secondary light sources formed on back side focal planes of the fly's eye lenses 6 of the partial illumination optical systems ILS1 to ILS4, illuminate variable field diaphragms 8 via light-collecting lenses 7 respectively. The light fluxes, from the variable field diaphragms 8, substantially uniformly illuminate, via relay optical systems 9, illumination areas (illumination field areas) IF1, IF2, IF3, IF4 each of which has a trapezoidal shape having two parallel sides in the Y direction on the mask MA (trapezoidal shape having two sides in the X direction parallel or inclined with respect to the Y direction). The illumination areas IF1 to IF4 are arranged in an array or a row in the Y direction. The variable field diaphragms 8 of the partial illumination optical systems ILS1 to ILS4 may be provided as a common field diaphragm member; and four apertures for field diaphragms, which are provided for the partial illumination optical systems ILS1 to ILS4, may be formed through the field diaphragm member.

As shown in FIG. 2, the light beams, from the illumination areas IF1 to IF4 of the mask MA, effect the exposure for exposure areas (image field areas or image fields) EF1, EF2, EF3, EF4 on the plate PT via first, second, third, and fourth projection optical systems PL1 PL2, PL3, PL4 corresponding thereto respectively. Each of the projection optical systems PL1 to PL4 is telecentric on the side of the mask MA and the side of the plate PT, and has a magnifying magnification from the side of the mask MA to the side of the plate PT. The shape of each of the exposure areas EF1 to EF2 is a shape obtained by magnifying the shape of one of the illumination areas IF1 to IF4 by a projection magnification of one of the projection optical systems PL1 to PL4. The projection optical systems PL1 to PL4 and the exposure areas EF1 to EF4 corresponding thereto are arranged in a row in the Y direction. The arrangement period or cycle of the illumination areas IF1 to IF4 in the Y direction is equal to the arrangement period or cycle of the exposure areas EF1 to EF4. The shape of each of the exposure areas EF1 to EF4 is defined by blocking or shielding a part of the illumination light beam by one of the variable field diaphragms 8. The variable field diaphragm 8 is constructed such that the size of the aperture allowing the illumination light beam to pass therethrough is changeable (expandable and shrinkable). Accordingly, the exposure width, which is the width of each of the exposure areas EF1 to EF4 in the Y direction, can be appropriately expanded and reduced.

In this embodiment, the projection optical device PL is constructed to include the four projection optical systems (partial projection optical systems) PL1 to PL4. Projected images, which are obtained by magnifying the patterns in the illumination areas IF1 to IF4 on the mask MA (first surface) by the common magnifying magnification (absolute value), are formed by the illumination optical systems PL1 to PL4 in the exposure areas EF1 to EF4 respectively on the surface (second surface) of the plate PT. Each of the projection optical systems PL1 to PL4 forms, on the plate PT, the image of the pattern of the mask MA which is erected in the X direction (scanning direction) and which is inverted in the Y direction (non-scanning direction). The magnifying magnification M is preferably not less than 2-fold. In this embodiment, the magnifying magnification M is, as an example, 2.5-fold.

With reference to FIG. 1, the mask MA is attracted and held on the mask stage MST via a mask holder (not shown). X axis and Y axis movement mirrors 50X, 50Y are fixed on the mask stage MST. A mask-side laser interferometer, which is constructed of X axis laser interferometers 22XA, 22XB and a Y axis laser interferometer 22Y, is arranged to be opposite to or face the X axis and Y axis movement mirrors 50X, 50Y. The mask-side laser interferometer measures the positions in the X direction and the Y direction of the mask stage MST and the angle of rotation in the θZ direction of the mask stage MST, and supplies obtained results of the measurement to the main control system 23. The main control system 23 controls the positions and the velocities in the X direction and the Y direction of the mask stage MST and the angle of rotation in the θZ direction of the mask stage MST via a stage-driving system (not shown) such as linear motors based on the measured values.

With reference to FIG. 2, the plate PT is attracted and held on the substrate stage PST via a substrate holder (not shown). X axis and Y axis movement mirrors 51X, 51Y are fixed to the substrate stage PST. Laser interferometers 21XA, 21XB, 21XC and an auxiliary laser interferometer 21XD, which radiate measuring laser beams in parallel to the X axis, are arranged at predetermined intervals in the Y direction to be opposite to the X axis movement mirror 51X. A laser interferometer 21YA and an auxiliary laser interferometer 21YB, which radiate measuring laser beams in parallel to the Y axis, are arranged at a predetermined interval in the X direction to be opposite to the Y axis movement mirror 51Y.

The positions in the X direction and the Y direction of the substrate stage PST are measured by the X axis laser interferometer 21XC and the Y axis laser interferometer 21YA. The angle of rotation in the θZ direction of the substrate stage PST during the scanning exposure is measured by the X axis laser interferometers 21XA, 21XB disposed on the both sides. The angle of rotation in the θZ direction of the substrate stage PST, which is brought about when the substrate stage PST is step-moved in the Y direction, is measured by the Y axis laser interferometer 21YA and the auxiliary laser interferometer 21YB. The usage of the X axis auxiliary laser interferometer 21XD will be described later on. For example, in such a case that the straightness is satisfactory for the movement mirrors 51X, 51Y, it is also allowable, regarding the X axis laser interferometers 21XA to 21XD, to provide only two-axis laser interferometers (for example, 21XA, 21XB) among them; and it is possible to omit the Y axis auxiliary laser interferometer 21YB.

Measured values of the plate-side laser interferometer constructed of the laser interferometers 21XA to 21XD, 21YA, 21YB are supplied to the main control system 23 shown in FIG. 1. The main control system 23 controls the positions and the velocities in the X direction and the Y direction of the substrate stage PST via a stage-driving system such as linear motors (not shown) based on the measured values. During the scanning exposure, the mask stage MST is driven at a velocity V/M in the X direction (M represents the projection magnification), in synchronization with which the substrate stage PST is driven at a velocity V in the X direction. Since the images of the projection optical systems PL1 to PL4 are erecting images in the X direction, the scanning direction of the mask stage MST and the scanning direction of the substrate stage PST are same direction along with the X axis.

With reference to FIG. 2, for example, an alignment system ALG of the off-axis type based on the image processing system to perform the positional adjustment for the plate PT and an autofocus system (not shown) for measuring the positions (focus positions) in the Z direction of mask MA and the plate PT are arranged in the vicinity of the projection optical systems PL1 to PL4. Therefore, a plurality of alignment marks AM1 and a plurality of alignment marks AM2 are formed in the vicinity of the pattern transfer areas EP1, EP2 on the plate PT respectively. The image planes of the projection optical systems PL1 to PL5 are focused with respect to the surface of the plate PT by controlling, for example, the position of the mask stage MST in the Z direction with an unillustrated Z driving mechanism based on the measurement result obtained by the autofocus system and/or by driving individual focus mechanisms of the projection optical systems PL1 to PL4 which will be described later on.

In the substrate stage PST, a spatial image-measuring system 53 which is provided as an alignment system for measuring the positions of images of position-measuring marks on the mask MA projected via the projection optical systems PL1 to PL4. Detection signals obtained by the alignment system ALG and the spatial image-measuring system 53 are processed by an alignment signal processing system (not shown). The position information about the detection objective marks obtained by this process is supplied to the main control system 23.

Next, an explanation will be made about the construction of the partial illumination optical systems ILS1 to ILS4 and the projection optical systems PL1 to PL4 constructing the projection optical device PL of this embodiment. Representatively with reference to FIG. 3, the construction of the partial illumination optical system ILS1 and the projection optical system PL1 will be explained.

Figure 3:
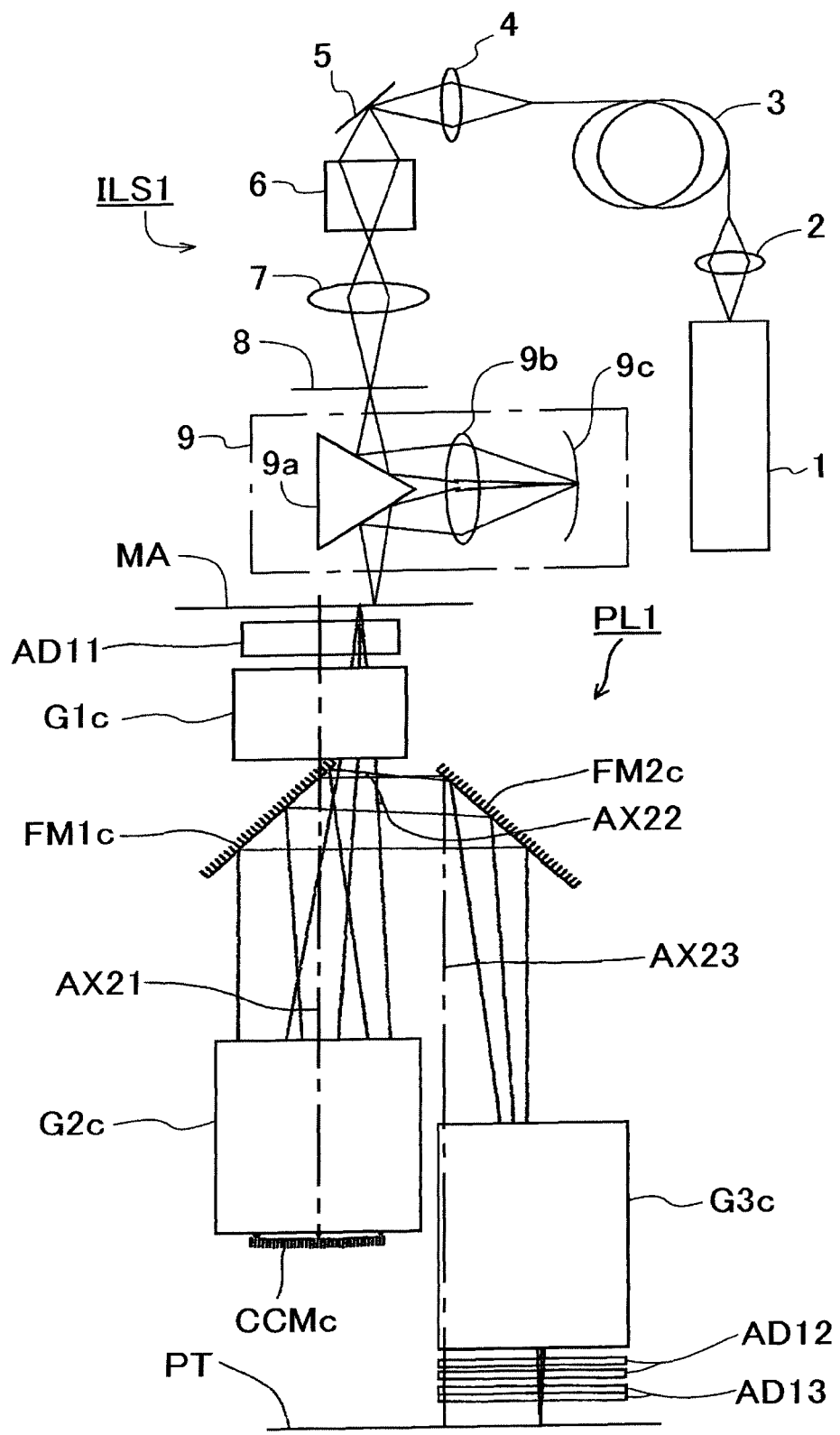
FIG. 3 shows a construction of a projection optical system PL1 and a partial illumination optical system ILS1 shown in FIG. 2.

FIG. 3 shows the construction of a part of the light source section 10 shown in FIG. 1, the partial illumination optical system ILS1, and the projection optical system PL1. With reference to FIG. 3, a laser light source 1 which generates the laser beam, a lens system 2 which collects the laser beam, and an optical guide 3 which transmits the collected laser beam are accommodated in the light source section 10 shown in FIG. 1. The illumination light beam, which is composed of the laser beam exiting from the optical guide 3, illuminates the mask MA via the optical members ranging from the collimator lens 4, a mirror 5 and the fly's eye lens 6 in the partial illumination optical system ILS1 to the relay optical system 9. The mirror 5 shown in FIG. 3 is omitted from FIG. 1.

The laser beam from the laser light source 1 may be branched and supplied to the four partial illumination optical systems ILS1 to ILS4. The laser beam may be transmitted via a mirror system without using the optical guide 3.

With reference to FIG. 3, the relay optical system 9 is constructed to include, as an example, a prism type mirror member 9a which folds or bends the optical path, a light-collecting lens 9B which collects the folded illumination light beam, and a concave mirror 9c which reflects and collects the collected illumination light beam. The relay optical system 9 forms, on the mask MA, an image (illumination area) inverted in the scanning direction of the aperture of the variable field diaphragm 8.

The projection optical system PL1 is provided with a concave reflecting mirror CCMc which is arranged in the optical path between the mask MA and the plate PT; a first lens group G1c which has an optical axis AX21 parallel to the Z axis and is arranged in the optical path between the mask MA and the concave reflecting mirror CCMc; a second lens group G2c which is arranged in the optical path between the first lens group G1c and the concave reflecting mirror CCMc; a first deflecting member FM1c which is arranged in the optical path between the second lens group G2c and the plate PT and which deflects the light beam, traveling in the +Z direction from the second lens group G2c, along with an optical axis AX22 so that the light beam traverses the optical axis AX21 in the +X direction; a second deflecting member FM2c which is arranged in the optical path between the first deflecting member FM1c and the plate PT and which deflects, in the -Z direction, the light beam traveling in the +X direction from the first deflecting member FM1c; and a third lens group G3c which is arranged in the optical path between the second deflecting member FM2c and the plate PT and which has an optical axis AX23 parallel to the optical axis AX21 of the first lens group G1c.

A magnification-correcting mechanism AD11, which includes a plurality of lenses having changeable intervals therebetween, is arranged between the first lens group G1c and the mask MA. An image shift-correcting mechanism AD12 for the X direction and the Y direction which includes two plane-parallels having variable angles of inclination, and a focus-correcting mechanism AD13 which includes, for example, two wedge-shaped prisms are arranged between the third lens group G3c and the plate PT.

The other projection optical systems PL2 to PL4 are also constructed in the same manner as described above. The magnification-correcting mechanisms AD11, the image shift-correcting mechanisms AD12, and the focus-correcting mechanisms AD13 (image formation characteristic-correcting mechanisms) of the projection optical systems PL1 to PL4 can be controlled by driving sections (not shown) respectively independently from each other. The construction of the projection optical systems PL1 to PL4 is not limited to the construction shown in FIG. 3.

On the other hand, as shown in FIG. 1, pattern areas A1, A2, A3, A4, each of which has a rectangular shape long in the X direction, are formed at predetermined intervals (predetermined periods) in the Y direction on the pattern surface of the mask MA of this embodiment. The number of the pattern areas A1 to A4 is set corresponding to the number of the projection optical systems PL1 to PL4.

Figure 4A:
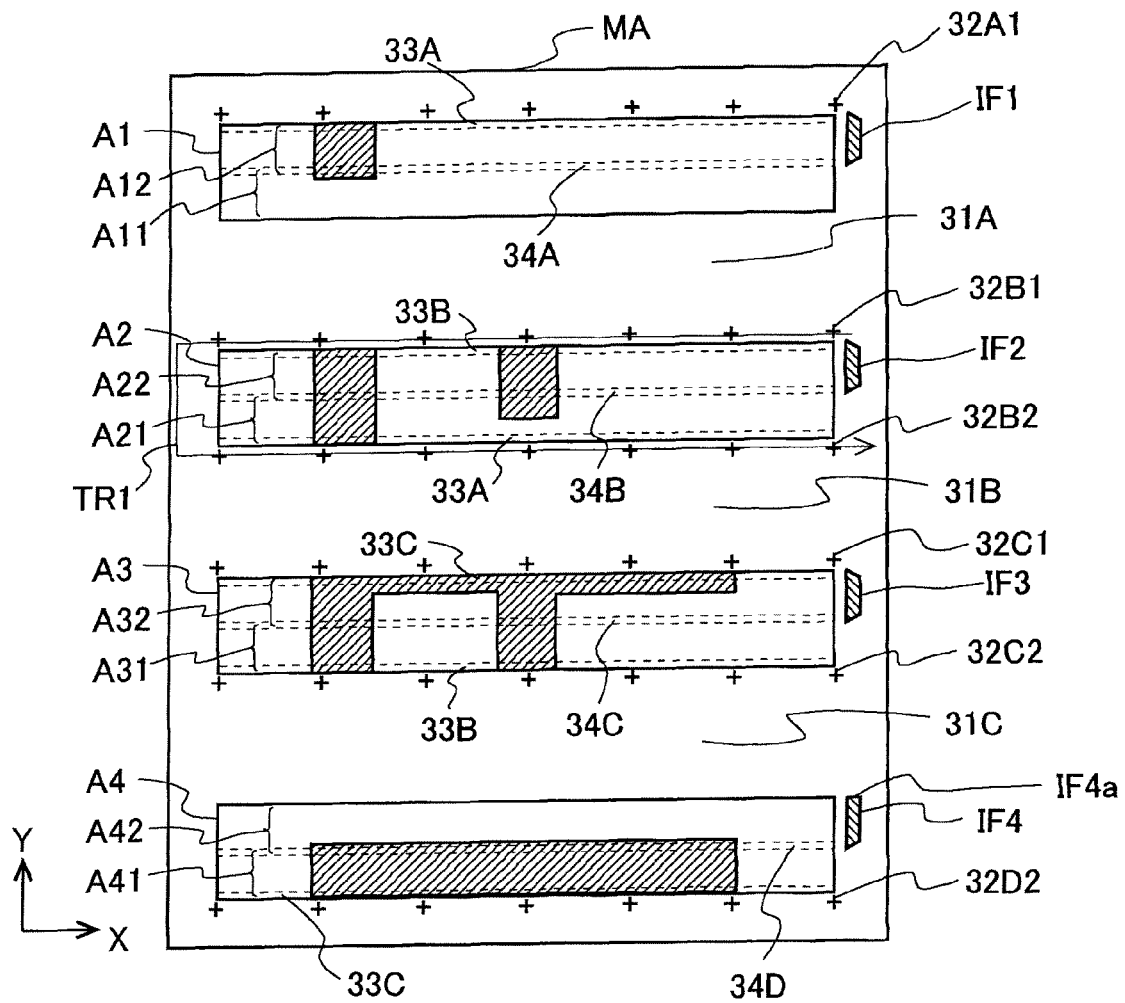
FIG. 4A shows a plan view of a mask MA shown in FIG. 2.
Figure 4B:
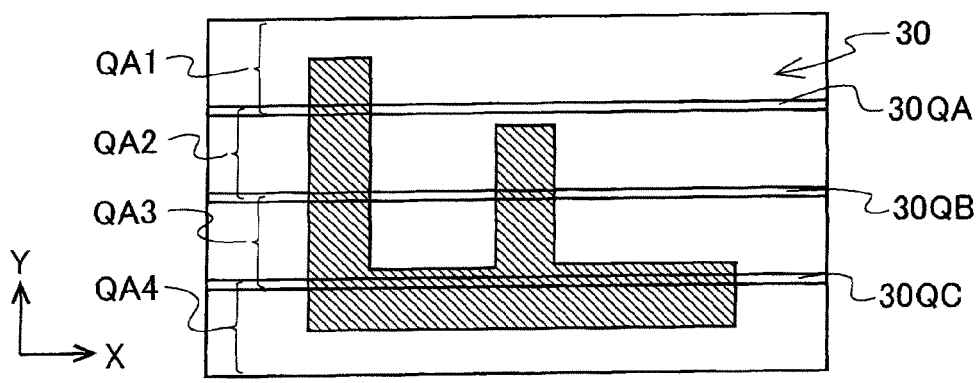
FIG. 4B shows an original device pattern of a pattern formed on the mask MA.

FIG. 4A shows a plan view of the mask MA shown in FIG. 1. FIG. 4B illustrates a device pattern 30 (depicted by a letter "F" for the convenience of explanation) to be formed in each of the pattern transfer areas EP1, EP2 of the plate PT shown in FIG. 1. In this case, the patterns, which are to be formed in the four pattern areas A1 to A4 of the mask MA, are the patterns obtained by reducing partial device patterns QA1 to QA4, which are obtained by equally dividing the device pattern 30 shown in FIG. 4B into four, with overlapped portions 30QA, 30QB, 30QC having predetermined widths in the Y direction respectively as boundary portions, 1/M-fold (M represents the magnifying magnification of each of the projection optical systems PL1 to PL4), and then by inverting the partial device patterns QA1 to QA4 individually in the Y direction (non-scanning direction). With reference to FIG. 4A, an overlapped portion 33A in the +Y direction of the pattern area A1 and an overlapped portion 33A in the -Y direction of the pattern area A2 correspond to an overlapped portion 30QA shown in FIG. 4B. Similarly, two overlapped portions 33B and two overlapped portions 33C shown in FIG. 4A correspond to an overlapped portion 30QB and an overlapped portion 30QC shown in FIG. 4B respectively.

The magnifying magnification M of each of the projection optical systems PL1 to PL4 shown in FIG. 1 is 2.5. Therefore, the widths of inter-pattern areas 31A, 31B, 31C, which are located between the pattern areas A1 to A4 of the mask MA in the Y direction, are wider than the widths of the pattern areas A1 to A4.

Further, with reference to FIG. 4A, the widths of the pattern areas A1 to A4 in the Y direction are approximately defined to be about twice the widths in the Y direction of the illumination areas IF1 to IF4 to be illuminated by the illumination device IU shown in FIG. 1 and consequently about twice the widths in the Y direction of the fields on the object plane side of the projection optical systems PL1 to PL4. In this embodiment, the respective pattern areas A1 to A4 of the mask MA are divided into first partial pattern areas A11, A21, A31, A41 each of which is disposed on the side in the -Y direction and second partial pattern areas A12, A22, A32, A42 each of which is disposed on the side in the +Y direction, with overlapped portions 34A, 34B, 34C, 34D, each having a predetermined width, intervening therebetween in the Y direction respectively. The patterns of the first partial pattern areas A11 to A41 disposed on the side in the -Y direction are subjected to the exposure on the plate PT by one time of the scanning exposure; and the patterns of the second partial pattern areas A12 to A42 disposed on the side in the +Y direction are subjected to the exposure on the plate PT by one time of the scanning exposure.

In this case, a plurality of two-dimensional position-measuring marks 32A1 are formed in a predetermined period in the X direction in a predetermined positional relationship with respect to the pattern area A1 (partial pattern area A12) in the vicinity of the pattern area A1 on the side in the +Y direction. Similarly, a plurality of position-measuring marks 32B2, 32B1 are formed in the vicinity of the partial pattern areas A21, A22 in predetermined positional relationships with respect to the areas. A plurality of position-measuring marks 32C2, 32C1 are formed in the vicinity of the partial pattern areas A31, A32 in predetermined positional relationships with respect to the areas. A plurality of position-measuring marks 32D2 are formed in the vicinity of the pattern area A4 in a predetermined positional relationship with respect to the pattern area A4 (partial pattern area A41). The position-measuring marks 32B1, the position-measuring marks 32B2, 32C1, and the position-measuring marks 32C2 are formed in the inter-pattern areas 31A, 31B, 31C respectively.

Figure 5:
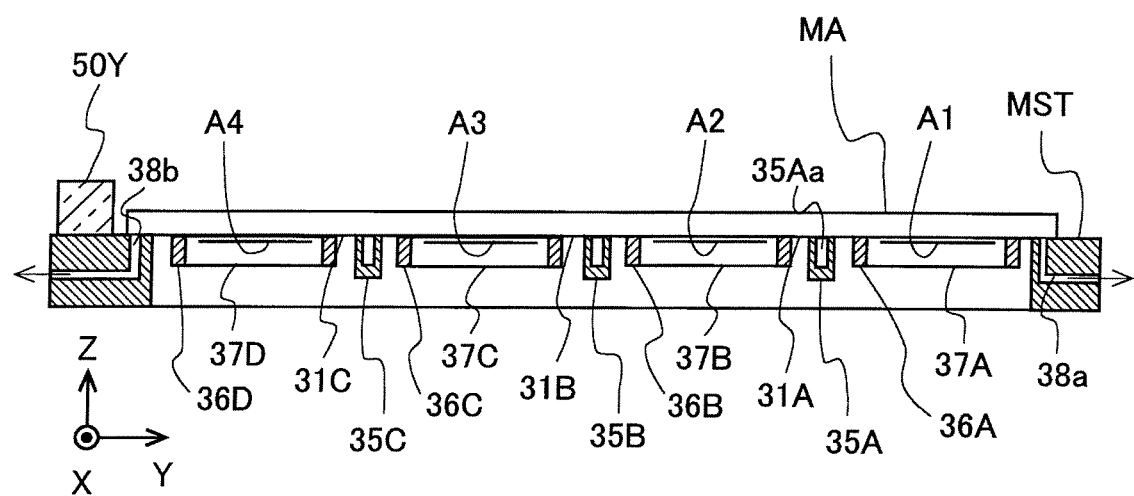
FIG. 5 shows a sectional view of the mask stage MST shown in FIG. 1.

FIG. 5 shows a sectional view of the mask stage MST shown in FIG. 1. With reference to FIG. 5, support portions 35A, 35B, 35C are provided in a bridged manner on a placing surface, for the mask MA, of the mask stage MST so that central portions of the inter-pattern areas 31A, 31B, 31C of the mask MA are supported. By supporting the inter-pattern areas 31A to 31C as described above, it is possible to make the warpage of the mask MA small even when the mask MA is large-sized, thereby making it possible to transfer the pattern of the mask MA onto the plate PT highly accurately.

Suction holes 35Aa, etc. each of which is connected to a vacuum pump (not shown) are formed at upper portions of the support portions 35A to 35C. Suction holes 38a, 38b, etc. which are connected to the vacuum pump (not shown) are also formed at a circumferential portion, of the mask stage MST, surrounding the mask MA. Owing to the suction holes, the mask MA is stably attracted and held by suction. Alternatively, the mask MA may be electrostatically attracted.

With reference to FIG. 5, dust-preventive or dust-proof pellicles (protective films) 37A, 37B, 37C, 37D, each of which has a thickness of, for example, about 1 μm and each of which is formed of a thin film of an organic material and through which the illumination light beam is transmissive, are provided on the pattern surface of the mask MA in a stretched form via frame-shaped pellicle frames 36A, 36B, 36C, 36D so that the pattern areas A1 to A4 and the position-measuring marks are covered with dust-preventive pellicles 37A, 37B, 37C, 37D, respectively. Accordingly, the respective pattern areas A1 to A4 are prevented from the adhesion of foreign matter such as the dust or the like. When the pellicles are individually provided for the respective pattern areas A1 to A4, the pellicles are less likely to be damaged than a case that the entire surface of the pattern surface of the mask MA is covered with one sheet of the pellicle. Further, the individual pellicles are small-sized, and thus it is possible to improve the yield when the pellicles are produced, thereby reducing the cost of the pellicles.

Next, an explanation will be made about the relationship between the plate PT and the mask MA shown in FIG. 2. At first, it is assumed that Mx represents the width of the mask MA in the X direction, My represents the width of the mask MA in the Y direction; Px represents the width of the plate PT in the X direction, and Py represents the width of the plate PT in the Y direction. On this assumption, the plate size, the mask size, and the magnifying magnification M are selected so that the following relationships hold among the widths Mx, My, Px, Py.

$$Mx > Px/M \quad (1)$$

$$My > Py/2 \quad (2)$$

The plate PT can be placed longitudinally or latitudinally (in a state of rotation by 90°) on the substrate stage PST. It is assumed that Px and Py in the expressions (1) and (2) are those having the larger sizes among the longitudinal and latitudinal sizes of the plate PT respectively.

Figure 6A:
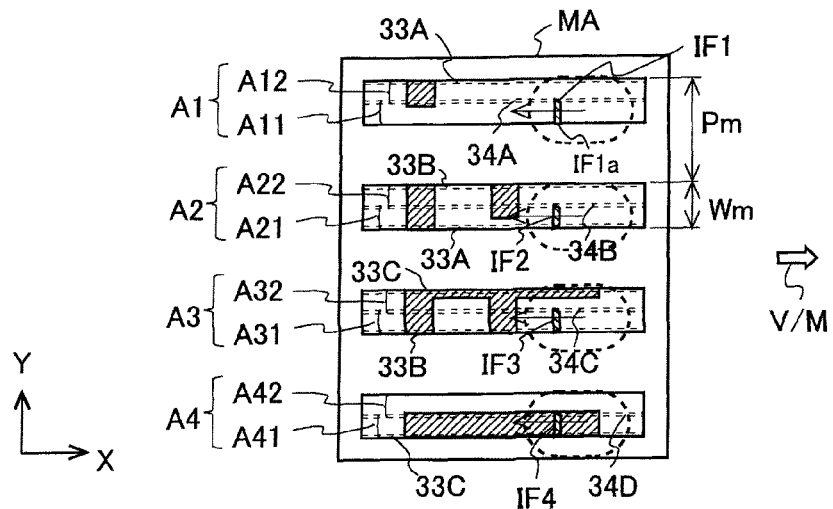
FIG. 6A shows a plan view of the mask MA during the scanning exposure performed for the first time.
Figure 6B:
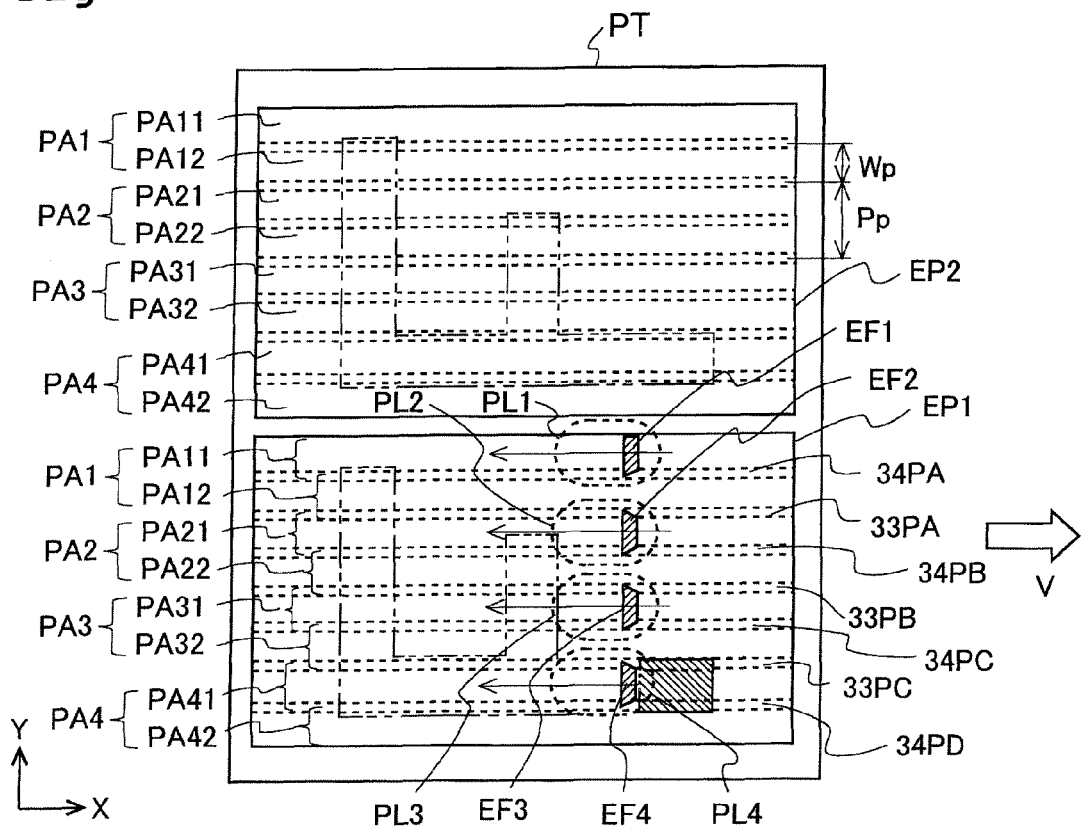
FIG. 6B shows a plan view of a plate PT corresponding to FIG. 6A.

On the other hand, FIG. 6A shows the pattern of the mask MA shown in FIG. 4A. FIG. 6B shows the plate PT shown in FIG. 2 to which the magnified image of the pattern of the mask MA shown in FIG. 6A (device pattern 30 shown in FIG. 4B) is transferred. With reference to FIG. 6B, the surface of the plate PT is divided in Y direction into two areas of the pattern transfer areas EP1, EP2. The first pattern transfer area EP1 is divided in the Y direction into transfer areas PA1, PA2, PA3, PA4 each of which has a width Pp and onto which the magnified images of the patterns of the pattern areas A1 to A4 of the mask MA shown in FIG. 6A are exposed respectively while being inverted in the Y direction and stitched with stitch portions 33PA, 33PB, 33PC intervening therebetween. The stitch portions 33PA to 33PC are exposed with the images of the patterns of the overlapped portions 33A to 33C, respectively, of the mask MA shown in FIG. 6A while being overlaid.

Further, the transfer areas PA1 to PA4 are divided into first divided transfer areas PA11, PA21, PA31, PA41 each of which has a width Wp, which are disposed on the side in the +Y direction, and which are exposed with magnified images of the first partial pattern areas A11 to A41 of the mask MA respectively, and second divided transfer areas PA12, PA22, PA32, PA42 each of which has a width Wp, which are disposed on the side in the −Y direction, and which are exposed with magnified images of the second partial pattern areas A12 to A42 of the mask MA respectively. Stitch portions 34PA, 34PB, 34PC, 34PD, which are exposed with images of the overlapped portions 34A to 34D in the pattern areas A1 to A4 shown in FIG. 6A in an overlapped manner respectively, are formed between the first divided transfer areas PA11 to PA41 and the second divided transfer areas PA12 to PA42 in the transfer areas PA1 to PA4.

Similarly, the second pattern transfer area EP2 of the plate PT is also divided into four transfer areas PAi which are formed of divided transfer areas PAi1, PAi2 (i=1 to 4) respectively and which are exposed with magnified images of the patterns of the pattern areas Ai of the mask MA.

In this procedure, it is assumed that Pm represents the arrangement period in the Y direction of the pattern areas A1 to A4 disposed on the side of the mask MA, and Wm represents the width in the Y direction of the pattern areas A1 to A4. On this assumption, the following relationships hold by using the magnifying magnification M, the width Wp in the Y direction of the divided transfer areas PA11, PA12, etc. of the plate PT, and the width Pp in the Y direction of the transfer area PA1, etc. (equal to the arrangement interval of the projection optical systems PL1 to PL4).

$$Pm > Wm \geq (Wp \times 2)/M \quad (3)$$

$$Pm = Pp = Wp \times 2 \quad (4)$$

In this case, the width Wp in the Y direction of the divided transfer areas PA11 to PA41, PA12 to PA42 of the transfer areas PA1 to PA4, respectively, of the pattern transfer area EP1 of the plate PT is equal to the width in the Y direction of the exposure areas EF1 to EF4 of the projection optical systems PL1 to PL4, i.e., the exposure width. The exposure width is defined, as an example, as the width in the Y direction at the central portion in the X direction in each of the trapezoidal exposure areas EF1 to EF4 defined by the variable field diaphragm 8. Alternatively, the exposure width is defined as the width with which the totalized exposure amount on the plate PT during the scanning for each of the exposure areas EF1 to EF4 is a half of a predetermined totalized exposure amount obtained upon the completion of the scanning in a case that the plate PT is subjected to the scanning exposure with the exposure areas EF1 to EF4 not via the pattern of the mask MA.

The interval or the spacing distance in the Y direction between the laser beams from the X axis laser interferometer 21XC shown in FIG. 2 and the auxiliary laser interferometer 21XD is equal to the width (exposure width) Wp in the Y direction of the divided transfer areas PA11, PA12, etc. of the plate PT.

The image shift amount to be brought about by the image shift-correcting mechanism AD12 shown in FIG. 3 of each of the projection optical systems PL1 to PL4, the correction amount of the magnification to be brought about by the magnification-correcting mechanism AD11, and the angles of rotation of the deflecting members FM1c, FM2c are corrected so that the exposure area EF1 to EF4 (image of the pattern of the mask MA) is correctly overlaid with respect to the pattern transfer area EP1 (EP2) of the plate PT in accordance with the result of the alignment during the exposure.

An explanation will be made below with reference to a flow chart shown in FIG. 9 (9A and 9B) about an example of the exposure operation of the exposure apparatus 100. The exposure operation described below is controlled by the main control system 23.

At first, it is assumed that the mask MA is placed on the mask stage MST. On this assumption, in order to perform the alignment for the mask MA, as an example, the light-receiving surface of the spatial image-measuring system 53 on the substrate stage PST is moved to the exposure area EF2 of the projection optical system PL2. The actual position in the Z direction of the light-receiving surface is at a height same as that of the surface of the plate PT. The mask stage MST is moved in the X direction and the Y direction to move the illumination area IF2 relative to the mask MA along the locus TR1 as shown in FIG. 4A to successively illuminate the plurality of position-measuring marks 32B1, 32B2 with the illumination area IF2. The positions of the images of the marks formed by the projection optical system PL2 are measured by the spatial image-measuring system 53. Similarly, the positions of the images of the other plurality of position-measuring marks 32A1, 32C1, 32C2, 32D2 on the mask MA are also measured by the spatial image-measuring system 53. Accordingly, it is possible to measure the positions of the images of the pattern areas A1 to A4 of the mask MA (partial pattern areas A11 to A41, A12 to A42). Based on the obtained result, the images of the partial pattern areas A11 to A41, A12 to A42 can be subjected to the exposure while being correctly stitched in the X direction and the Y direction on the plate PT.

Subsequently, in Step 101 shown in FIGS. 9A and 9B, the plate on the substrate stage PST shown in FIG. 2 is exchanged with a plate PT coated with the photoresist as the exposure objective. Subsequently, in Step 102, in order to perform the alignment for the first pattern transfer area EP1 of the plate PT, the substrate stage PST is driven to step-move the plate PT in the X direction and the Y direction, while the alignment system ALG is used to measure the positions of the plurality of alignment marks AM1 of the pattern transfer area EP1. Subsequently, in Step 103, in order to perform the alignment for the second pattern transfer area EP2 of the plate PT, the plate PT is step-moved in the X direction and the Y direction, while the alignment system ALG is used to measure the positions of the plurality of alignment marks AM2 of the pattern transfer area EP2. The number of the alignment system ALG is not limited to one. A plurality of alignment systems ALG may be provided. In this case, in Steps 102, 103, it is possible to simultaneously measure the plurality of marks possessed by the alignment marks AM1, AM2 respectively. In Steps 102, 103, the alignment marks AM1, AM2 are successively measured. However, the alignment marks AM1, AM2 may be measured simultaneously.

Subsequently, in Step 104, a state is firstly given, based on the result of the alignment described above, in which the images of the pattern areas A1 to A4 of the mask MA are overlapped with the transfer areas PA1 to PA4 respectively of the pattern transfer area EP1 of the plate PT. As shown in FIG. 6A, the mask MA is moved at the velocity V/M in the +X direction, and the illumination areas IF1 to IF4 are scanned in the X direction relative to the first partial pattern areas A11 to A41 of the pattern areas A1 to A4 of the mask MA. Further, synchronously with this, as shown in FIG. 6B, the plate PT is moved at the velocity V in the +X direction, and the exposure areas EF1 to EF4 are scanned in the X direction relative to the first divided transfer areas PA11 to PA41 each as the half portion disposed on the side in the +Y direction of one of the transfer areas PA1 to PA4 of the pattern transfer area EP1. With this, the first divided transfer areas PA11 to PA41 of the pattern transfer area EP1 are subjected to the scanning exposure with the images of the patterns (images inverted in the Y direction) of the first partial pattern areas A11 to A41 of the mask MA respectively.

In this procedure, the overlapped portions 33A to 33C, 34A to 34D of the mask MA are scanned across (with) the oblique side portions of the trapezoidal illumination areas IF1 to IF4. The edge portion in the −Y direction of the partial pattern area A11 is not the stitch portion. Therefore, the end portion IF1a of the illumination area IF1, which makes contact with the edge portion, is parallel to the X axis. The change of the shapes of the illumination areas IF1 and IF4 (described later on) as described above can be executed, for example, by switching the aperture of the variable field diaphragm 8 or opening/closing the end portion of the fixed aperture.

It is assumed that W represents the width (slit width) in the X direction of the exposure area EF1 to EF4 shown in FIG. 6B, P represents the illuminance of the illumination light beam on the plate surface, and E represents the sensitivity (exposure amount) of the photoresist. On this assumption, the scanning velocity V of the substrate stage PST is defined as follows in order to expose the photoresist with the appropriate exposure amount.

$$V=(P \times W)/E \qquad (5)$$

Figure 7A:
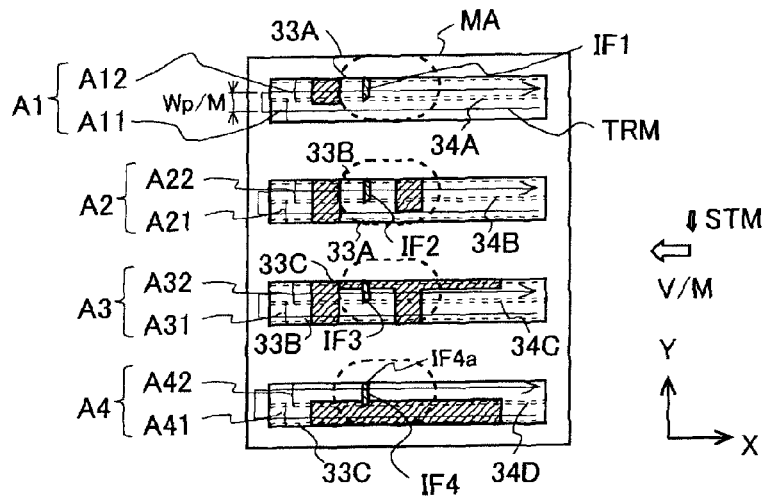
FIG. 7A shows a plan view of the mask MA during the scanning exposure performed for the second time.
Figure 7B:
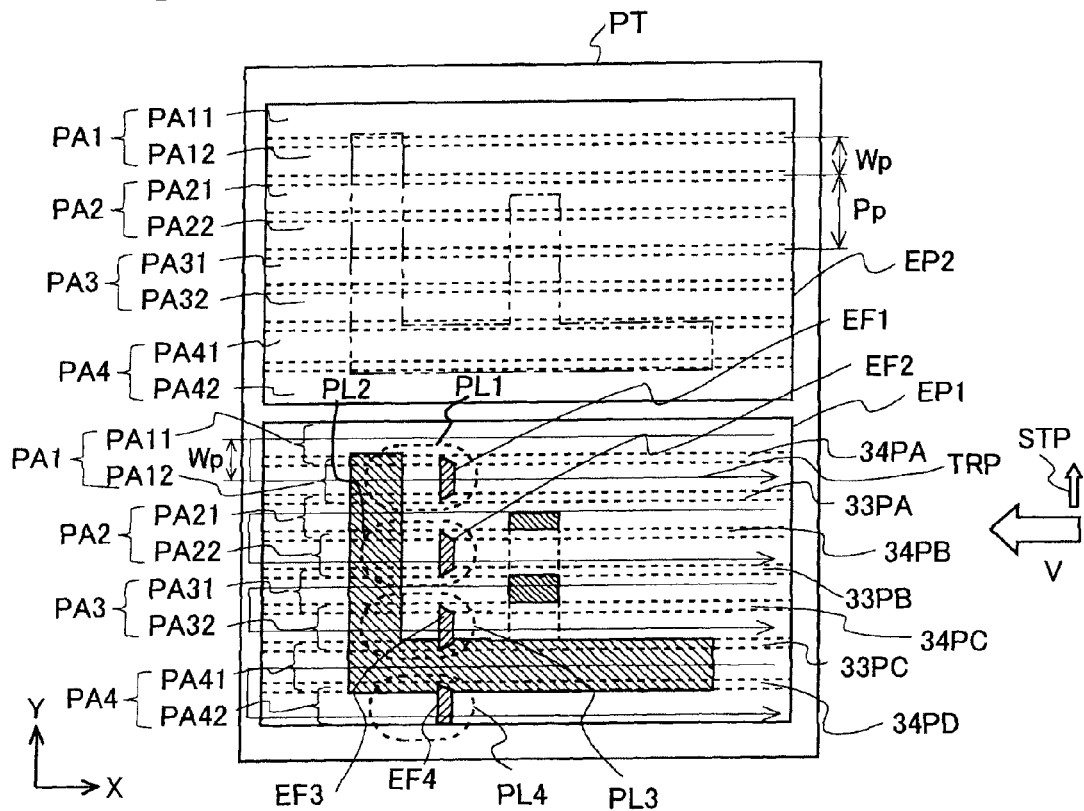
FIG. 7B shows a plan view of the plate PT corresponding to FIG. 7A.

Subsequently, in Step 105, as shown in FIG. 7A, the mask MA is step-moved by a distance Wp/M in the −Y direction (in the direction STM as shown in FIG. 7A) via the mask stage MST, substantially concurrently with which the plate PT is step-moved by a distance equal to the exposure width Wp in the +Y direction as the opposite direction (in the direction STP as shown in FIG. 7B) via the substrate stage PST. Subsequently, in Step 106, the mask MA is moved at the velocity V/M in the −X direction in a state that the images of the pattern areas A1 to A4 of the mask MA shown in FIG. 7A are overlapped with the transfer areas PA1 to PA4 of the first pattern transfer area EP1 of the plate PT shown in FIG. 7B, and the second partial pattern areas A12 to A42 of the pattern areas A1 to A4 of the mask MA are scanned in the X direction relative to the illumination areas IF1 to IF4 along a locus TRM. Synchronously with this, as shown in FIG. 7B, the plate PT is moved at the velocity V in the −X direction, and the second divided transfer areas PA12 to PA42, which are the halves of the transfer areas PA1 to PA4 of the pattern transfer area EP1 in the −Y direction, are scanned relative to the exposure areas EF1 to EF4 along the locus TRP.

Accordingly, the second divided transfer areas PA12 to PA42 of the pattern transfer area EP1 are subjected to the scanning exposure with the images (images inverted in the Y direction) of the patterns of the second partial pattern areas A12 to A42 of the mask MA respectively. Therefore, the entire surface of the pattern transfer area EP1 is exposed with the image which is identical with the device pattern 30 shown in FIG. 4B. Further, the stitch portions 33PA to 33PC, 34PA to 34PD of the plate PT are exposed with the images of the overlapped portions 33A to 33C, 34A to 34D of the mask MA in the overlaid manner respectively.

In this procedure, the overlapped portions 33A to 33C, 34A to 34D of the mask MA shown in FIG. 7A are scanned across (with) the oblique side portions of the illumination areas IF1 to IF4. The edge portion in the +Y direction of the partial pattern area A42 is not the stitch portion. Therefore, the end portion IF4a of the illumination area IF4 which makes contact with the edge portion is parallel to the X axis. When the overlapped portions 33A to 33C, 34A to 34D are scanned across the oblique side portions of the illumination areas IF1 to IF4, then the stitch portions 33PA to 33PC, 34PA to 34PD of the plate PT, which are exposed in the duplicate or overlapped manner by performing the scanning exposure twice, have the exposure amount which is equal to the exposure amount of the portions other than the stitch portions.

With reference to FIG. 2, the X axis laser interferometer 21XC and the auxiliary laser interferometer 21XD are previously reset before the start of the exposure so that the X axis laser interferometer 21XC and the auxiliary laser interferometer 21XD indicate the same measured value in a state that the radiation points of the laser beams are located at the same position in the X direction. Further, the projected images are subjected to the calibration so that the transferred images are correctly aligned. It is assumed that ΔX represents the difference between the measured values of the laser interferometer 21XC and the auxiliary laser interferometer 21XD as measured in Step 104 when the process proceeds from Step 104 to Step 106 shown in FIG. 9 (9A and 9B). In this case, the position in the X direction of the substrate stage PST is controlled based on the measured value of the laser interferometer 21XC, and the position in the X direction of the substrate stage PST is corrected by the amount of the difference ΔX in Step 106. Accordingly, even if any warpage arises in the X axis movement mirror 51X shown in FIG. 2, the exposure can be performed while adjusting the positions in the X direction of the first divided transfer areas PA11 to PA41 and the second divided transfer areas PA12 to PA42 of the pattern transfer area EP1 shown in FIG. 7B, thus reducing the stitch error.

Figure 8A:
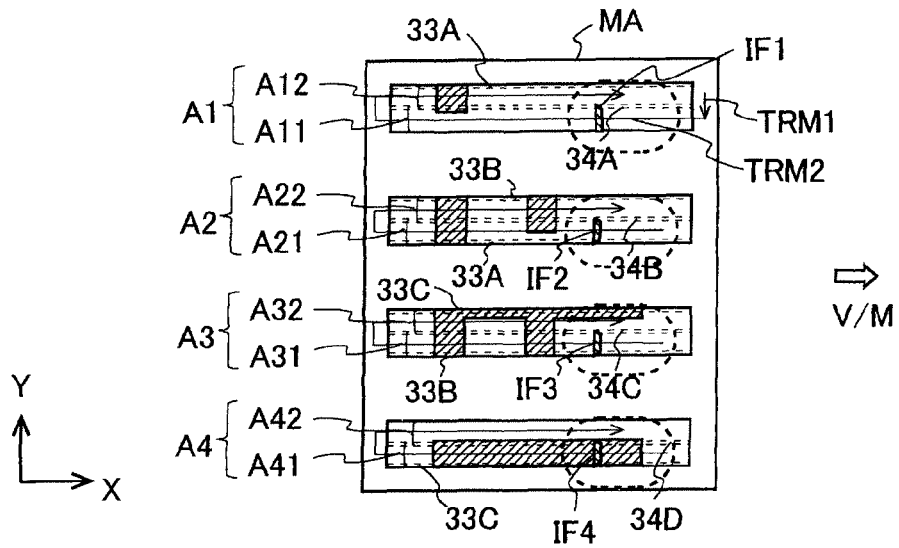
FIG. 8A shows a plan view of the mask MA during the scanning exposure for a pattern transfer area EP2 of the plate PT.
Figure 8B:
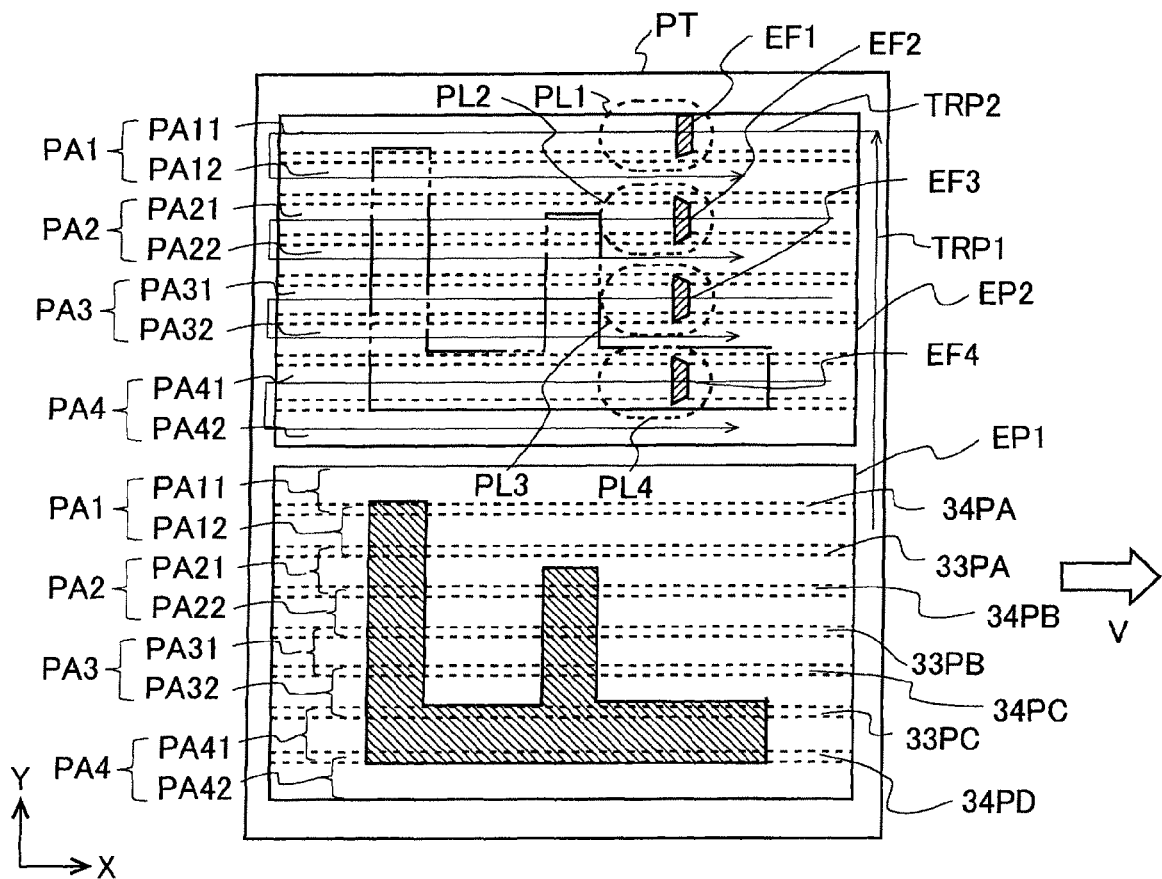
FIG. 8B shows a plan view of the plate PT corresponding to FIG. 8A.

Subsequently, in Step 107, the plate PT is step-moved in the −Y direction in an amount corresponding to the spacing distance between the centers of the pattern transfer areas EP1, EP2 via the substrate stage PST as shown in FIG. 8B, based on the alignment result obtained in Step 103. The first divided transfer areas PA11 to PA41 of the transfer areas PA1 to PA4 of the pattern transfer area EP2 are moved to the positions approaching the exposure areas EF1 to EF4 along the locus TRP1. Subsequently concurrently with this operation, as shown in FIG. 8A, the mask MA is step-moved in the +Y direction, and the partial pattern areas A11 to A41 of the pattern areas A1 to A4 are moved to the positions approaching the illumination areas IF1 to IF4 along a locus TRM1.

Subsequently, in Step 108, the plate PT is moved in the +X direction in synchronization with the movement of the mask MA in the +X direction as shown in FIGS. 8A and 8B in the same manner as in Step 104, thereby subjecting the first divided transfer areas PA11 to PA41 of the pattern transfer area EP2 of the plate PT to the scanning exposure with the images (images inverted in the Y direction) of the patterns of the first partial pattern areas A11 to A41 of the mask MA respectively. Subsequently, in Step 109, the mask MA is step-moved in the −Y direction by the distance Wp/M (see FIG. 7A) in the same manner as in Step 105. Substantially concurrently with this, the plate PT is step-moved in the +Y direction as the opposite direction by the distance Wp. Subsequently, in Step 110, the mask MA is moved in the +X direction corresponding to a locus TRM2 shown in FIG. 8A in the same manner as in Step 106, in synchronization with which the plate PT is moved in the +Y direction corresponding to a locus TRP2 shown in FIG. 8B, thereby subjecting the remaining second divided transfer areas PA12 to PA42 of the pattern transfer area EP2 of the plate PT to the scanning exposure with the images (images inverted in the Y direction) of the patterns of the second partial pattern areas A12 to A42 of the mask MA respectively. Thus, the entire surface of the pattern transfer area EP2 is exposed in a uniform exposure amount distribution while stitching the images same as that of the device pattern 30 shown in FIG. 4B.

Subsequently, in Step 111, if there is any plate to be exposed, the process proceeds to Step 112; the substrate stage PST is moved to the exchange position for the plate PT, and the process proceeds to Step 101. If there is no plate to be exposed in Step 111, then the plate PT is discharged (unloaded) from the substrate stage PST, and the exposure step comes to an end.

Figure 10A:
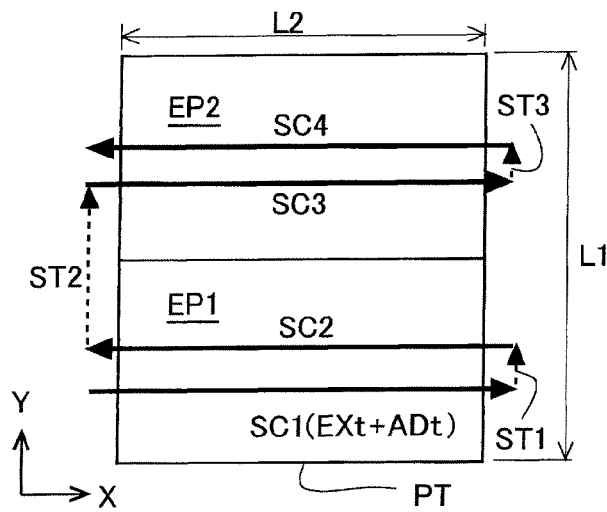
FIG. 10A illustrates the exposure operation for a mask for preparing two areas.

The exposure method of this embodiment is summarized as shown in FIG. 10A. That is, width L2 in the X direction and width L1 in the Y direction of the plate PT shown in FIG. 10A are, for example, 3.2 m and 2.8 m respectively. In this embodiment, each of the pattern transfer areas EP1, EP2 of the plate PT is exposed by two times of the scanning exposure operations SC1, SC2 and SC3, SC4 in which the substrate stage PST is subjected to the scanning in the X direction and the −X direction respectively. During this process, the substrate stage PST performs three times of step movement, namely step movement ST1, ST2, ST3. Each of the scanning exposure operations SC1, etc. includes an exposure time EXt at a constant velocity and an acceleration/deceleration time Adt. As described above, in this embodiment, the entire surface of the plate PT for preparing the two areas or fields can be exposed at a high throughput by performing the scanning exposure four times.

Figure 10B:
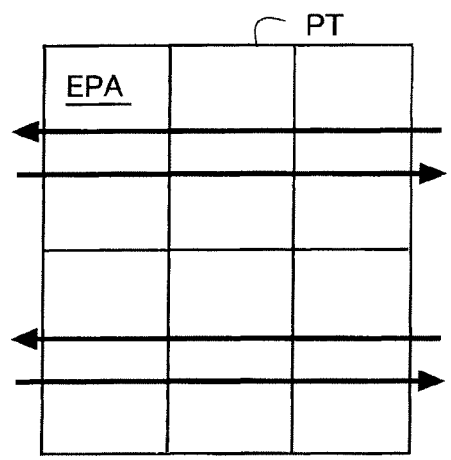
FIG. 10B illustrates the exposure operation for a mask for preparing six areas.
Figure 10C:
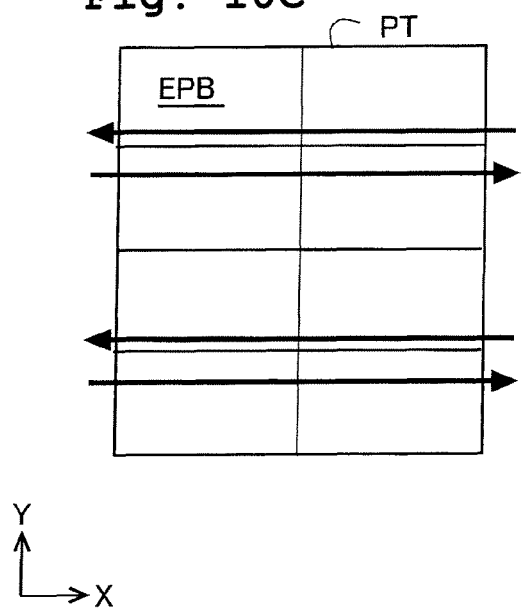
FIG. 10C illustrates the exposure operation for a mask for preparing four areas.

On the other hand, when six areas of pattern transfer areas EPA, to which the identical device pattern is to be transferred, are provided on one sheet of plate PT as shown in FIG. 10B, and when eight areas of pattern transfer areas EPB, to which the identical device pattern is to be transferred, are provided on one sheet of plate PT as shown in FIG. 10C, then the entire surface of the plate PT can be also exposed at a high throughput by performing the scanning exposure four times respectively in accordance with the exposure method of this embodiment. In the case of FIG. 10B, the pattern, which corresponds to three device patterns, is formed on the mask MA. In the case of FIG. 10C, the pattern, which corresponds to four device patterns, is formed on the mask MA.

An exemplary positional adjustment method will be explained with reference to FIGS. 11 and 12 to be adopted in a case that a positional deviation arises between the substrate stage PST (plate PT) and the mask stage MST (mask MA) during the scanning exposure in the embodiment described above.

Figure 11A:
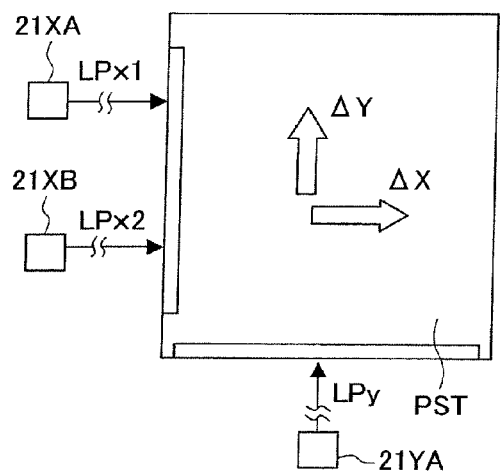
FIG. 11 (11A and 11B) illustrates a correcting method for the shift of a substrate stage PST.
Figure 11B:
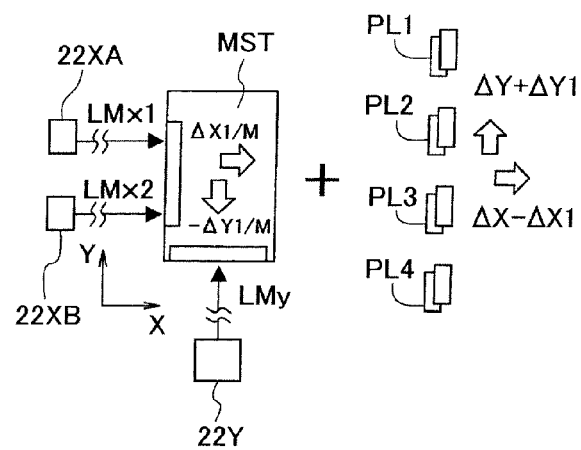

In a case that the position of the substrate stage PST is shifted by ΔX, ΔY in the X direction and the Y direction from the target position as shown in FIG. 11A, then at first, the correction is roughly performed by moving the mask stage MST in the X direction by ΔX1/M (M represents the magnifying magnification of the projection optical system PL1 to PL4) and moving the mask stage MST in the Y direction by −ΔY/M as shown in FIG. 11B. The reason, why the signs of the correction amount in the Y direction are opposite to each other, is that the images of the projection optical systems PL1 to PL4 shown in FIG. 2 are inverted in the Y direction. The position and the angle of rotation of the substrate stage PST are measured, for example, by the X axis laser interferometers 21XA, 21XB which radiate the laser beans LPx1, LPx2 in parallel to the X axis and the Y axis laser interferometer 21YA which radiates the laser beam LPy in parallel to the Y axis. Similarly, the position and the angle of rotation of the mask stage MST are measured, for example, by the X axis laser interferometers 22XA, 22XB which radiate the laser beams LMx1, LMx2 in parallel to the X axis and the Y axis laser interferometer 22Y which radiates the laser beam LMy in parallel to the Y axis.

Further, the values, which are obtained by converting the shift amount of the mask stage MST into the shift amount on the substrate stage PST, are ΔX1, −ΔY1. Accordingly, the image of the pattern of the mask MA is shifted by the residual difference of the shift amount (ΔX−ΔX1, ΔY+ΔY1) by using the image shift-correcting mechanism AD12 shown in FIG. 3 of the projection optical system PL1 to PL4. Accordingly, the shift of the substrate stage PST can be corrected highly accurately at a high following velocity.

Figure 12A:
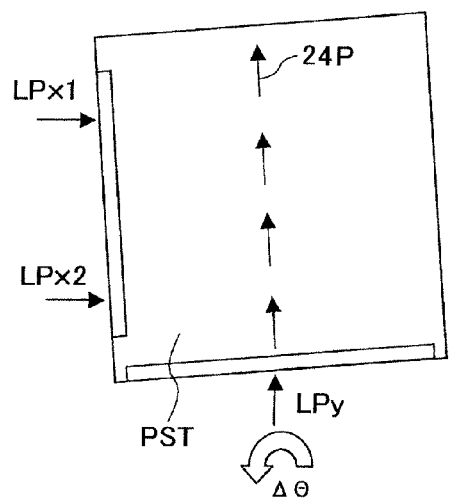
FIG. 12 (12A and 12B) illustrates a correcting method for the rotation of the substrate stage PST.
Figure 12B:
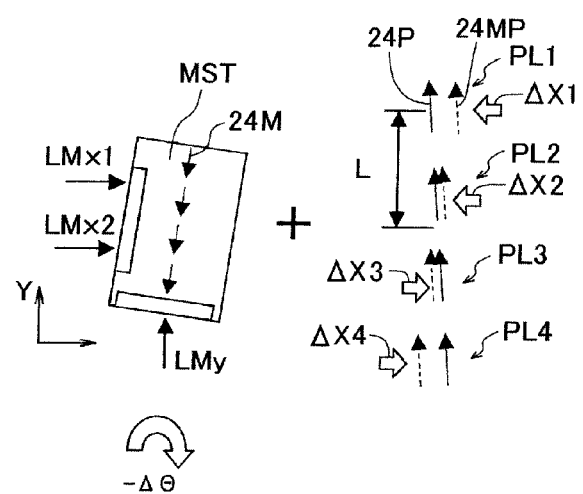

On the other hand, as shown in FIG. 12A, in a case that the angle of rotation in the θZ direction of the substrate stage PST (for example, the direction of arrangement of the divided transfer areas at the plate center indicated by the arrow 24P) is deviated by Δθ in the counterclockwise direction from the target value, the mask stage MST (direction of arrangement of the partial pattern areas at the mask center indicated by the arrow 24M) is rotated by the angle Δθ in the clockwise direction as shown in FIG. 12B. In this case, the images of the projection optical systems PL1 to PL4 shown in FIG. 2 are erected in the X direction and inverted in the Y direction. Therefore, the direction of arrangement of the images of the partial pattern areas of the mask MA brought about by the projection optical systems PL1 to PL4 are parallel to the direction of arrangement of the arrow 24P on the plate as indicated by the arrow 24MP. However, the positions of the images of the partial pattern areas of the mask MA brought about by the projection optical systems PL1 to PL4 are shifted by ΔX1, ΔX2, ΔX3, ΔX4, respectively, in the X direction with respect to the substrate stage PST (divided transfer areas of the plate). The shift amounts ΔX1 to ΔX4 are approximately −2·Δθ·L provided that L represents the spacing distance in the Y direction between the center of rotation of the mask stage MST and the projection optical system PL1 to PL4. Accordingly, the shift amount in the X direction, which is generated by the rotation of the mask stage MST as described above, is corrected by using the image shift-correcting mechanism AD12 shown in FIG. 3 of the projection optical system PL1 to PL4. Accordingly, the angle of rotation of the substrate stage PST can be corrected highly accurately at a high following velocity.

The function, the effect, etc. of this embodiment are as follows.

(1) The exposure apparatus 100 of the embodiment described above includes the plurality of projection optical systems PL1 to PL4 which are provided or arranged at an interval and each of which has the magnifying magnification; the mask stage MST (pattern-arranging mechanism) which arranges, in the Y direction (predetermined direction), the pattern areas A1 to A4 with respect to the projection optical systems PL1 to PL4 respectively and which moves the pattern areas A1 to A4 in the Y direction, the pattern areas A1 to A4 having the widths (area widths) each of which is smaller than the period of arrangement (arrangement interval) of the projection optical system PL1 to PL4 and greater than the width of one of the illumination areas IF1 to IF4 (width obtained by dividing the exposure width of the projection optical system PL1 to PL4 by the magnifying magnification M); the substrate stage PST (substrate-holding mechanism) which holds the plate PT and which moves the plate PT in the Y direction; and the main control system 23 (controller) which performs control to successively transfer, onto the plate PT, the projected image, projected by the projection optical system PL1 to PL4, of the pattern (first pattern) in the first partial pattern areas A11 to A41 in the pattern areas A1 to A4 respectively, and the projected image, projected by the projection optical system PL1 to PL4, of the pattern (second pattern) in the second partial pattern areas A12 to A42 in the pattern areas A1 to 4A respectively, the second partial pattern areas A12 to A42 having at least the overlapped portions 34A to 34D overlapping with the first partial pattern areas A11 to A41, respectively (partial areas of the second partial pattern areas A12 to A42 are different from the first partial pattern areas A11 to A41 in the Y direction in the pattern areas A1 to A4, respectively).

The exposure method, which is controlled by the main control system 23 of the exposure apparatus 100, includes a part of Step 104 and the movement operation of Step 105 (pattern-arranging step) of arranging, in the Y direction, the pattern areas A1 to A4 with respect to the projection optical systems PL1 to PL4 respectively which are arranged at the arrangement interval and each of which has the magnifying magnification, the pattern areas A1 to A4 having the widths each of which is smaller than the period of arrangement (arrangement interval) of the projection optical system PL1 to PL4 and greater than the width of one of the illumination areas IF1 to IF4; and Steps 104, 106 (exposure step) of successively transferring, onto the plate PT, the projected image, projected by the projection optical system PL1 to PL4, of the pattern (first pattern) provided in the first partial pattern areas A11 to A41 in the pattern areas A1 to A4 respectively and the projected image, projected by the projection optical system PL1 to PL4, of the pattern (second pattern) in the second partial pattern areas A12 to A42 in the pattern areas A1 to 4A respectively, the second partial pattern areas A12 to A42 having at least the overlapped portions 34A to 34D (partial areas of the second partial pattern areas A12 to A42 are different from the first partial pattern areas A11 to A41 in the Y direction in the pattern areas A1 to A4, respectively).

According to the embodiment, any drawing error of the mask pattern is not caused between the first partial pattern areas A11 to A41 and the second partial pattern areas A12 to A42 in the plurality of pattern areas A1 to A4 of the mask MA. Therefore, upon exposing the plate PT with the images of the patterns of the partial pattern areas, it is possible to suppress the occurrence of the stitch error at the stitch portions 34PA to 34PD, thereby making it possible to improve the transfer accuracy of the projected image of the entire mask pattern.

It is possible to shorten the movement amounts (movement strokes) in the Y direction of the mask MA and the plate PT in Step 105, as compared with a case that the first partial pattern areas A11 to A41 and the second partial pattern areas A12 to A42 are formed separately and away in the Y direction. Therefore, it is possible to miniaturize the base portion (stage mechanism) of the mask stage MST. It is also possible to miniaturize the mask MA itself.

In the embodiment described above, the patterns of the respective pattern areas A1 to A4 of the mask MA are transferred onto the plate PT by performing the scanning exposure twice. However, the widths in the Y direction of the respective pattern areas A1 to A4 may be set to be not less than three times the widths of the illumination areas IF1 to IF4, and the patterns of the respective pattern areas A1 to A4 may be transferred onto the plate PT by performing the scanning exposure three times or more.

In a case that the patterns of the respective pattern areas A1 to A4 are transferred onto the plate PT by performing the scanning exposure k time (k is an integer of not less than 3) as described above, the following expressions hold in place of the expressions (3) and (4) described above.

$$Pm > Wm \geq (Wp \times k)/M \quad (3A)$$

$$Pm = Pp = Wp \times k \quad (4A)$$

In these cases, in the scanning exposure to be performed for the second time (as the second scanning exposure) and thereafter, the width in the Y direction of the exposure area EF1 to EF4 can be made narrower than the exposure width Wp (maximum width) which is the width upon performing the scanning exposure for the first time (as the first scanning exposure). In this case, the following expression may hold in place of the expressions (3) and (4).

$$Pm > Wm > Wp/M \quad (3B)$$

The number of the pattern areas A1 to A4 of the mask MA (number of division in the Y direction of the pattern) is not limited to four, and may be appropriately determined corresponding to the number of arrangement of the projection optical systems.

(2) Each of the projection optical systems PL1 to PL4 forms the image inverted in the Y direction on the image plane; and the direction of movement of the mask MA in the Y direction in Step 105 and the direction of the plate PT are the opposite directions (toward the opposite sides). Accordingly, the images of the partial pattern areas A11 to A41, A12 to A42 of the pattern areas A1 to A4 respectively of the mask MA can be correctly stitched and exposed onto the plate PT.

Each of the projection optical systems PL1 to PL4 is not limited to the optical system projecting the image which is erected in the X direction and which is inverted in the Y direction. It is also possible to use an optical system projecting an image which is erected in the X direction and which is also erected in the Y direction, or an optical system projecting an image which is inverted in the X direction and which is erected or inverted in the Y direction.

(3) The projection optical systems PL1 to PL4 are arranged in one array or row in the Y direction. The directions of movement of the mask MA and the plate PT in Step 104 are opposite to the directions of movement of the mask MA and the plate PT in Step 106. Accordingly, since the mask MA and the plate PT can be subjected to the reciprocating scanning, it is possible to shorten the exposure time. Further, the pattern areas A1 to A4 of the mask MA can be arranged at an interval in the Y direction, because the projection optical systems PL1 to PL4 are arranged in one array in the Y direction. Thus, it is possible to miniaturize the mask MA.

It is not necessarily indispensable that the projection optical systems PL1 to PL4 are arranged in one array in the Y direction. In a case that the positions in the X direction of the projection optical systems PL1 to PL4 are different from each other, it is appropriate to adjust the positions in the X direction of the pattern areas A1 to A4 of the mask MA.

(4) The end portions in the Y direction of the first partial pattern areas A11 to A41 of the mask MA are overlapped with those of the second partial pattern areas A12 to A42 at the overlapped portions 34A to 34D. Accordingly, it is possible to reduce the stitch error when the exposure is performed while stitching the images with each other. In a case that sufficient pattern transfer accuracy can be obtained for the first partial pattern areas A11 to A41 and the second partial pattern areas A12 to A42 respectively, it is not necessarily indispensable to provide the overlapped portions 34A to 34D. It is allowable that the first partial pattern areas A11 to A41 and the second partial pattern areas A12 to A42 are provided adjacently. Correspondingly to this, it is also allowable that the first divided transfer areas PA11 to PA41 and the second divided transfer areas PA12 to PA42 are transferred adjacently without providing the stitch portions 34PA to 34PD.

(5) The period of arrangement (arrangement interval) in the Y direction of the projection optical systems PL1 to PL4 is twice the width in the Y direction of the exposure areas EF1 to EF4. Steps 104, 106 include the step of transferring the stitch portions 33PA to 33PC (imaged end portions) in the Y direction of the projected images of the patterns (second patterns) of the second partial pattern areas A12 to A32 of the mask MA while overlaying images of the stitch portions 33A to 33C as the stitch portions 33PA to 33PC with the images of the patterns of the first partial pattern areas A21 to A41 provided in the pattern areas A2 to A4 adjacent to the pattern areas A1 to A3 including the second partial pattern areas A12 to A32. Therefore, the plate PT can be subjected to the exposure while stitching the images of the plurality of pattern areas A1 to A4 of the mask MA in the Y direction.

The period of arrangement in the Y direction of the projection optical systems PL1 to PL4 may be an integral multiple of not less than three times the width in the Y direction of the exposure areas EF1 to EF4. For example, when the period is three times the width, the plate PT can be subjected to the exposure while stitching the images of the plurality of pattern areas of the mask MA in the Y direction by performing the scanning exposure three times.

(6) It is preferable that the magnifying magnification of the projection optical system PL1 to PL4 is at least 2-fold. Accordingly, it is possible to widen areas (inter-pattern areas 31A to 31C) in the Y direction between the pattern areas A1 to A4 of the mask MA. It is also possible to form a different mask pattern (another mask pattern) in such an area.

Figure 13A:
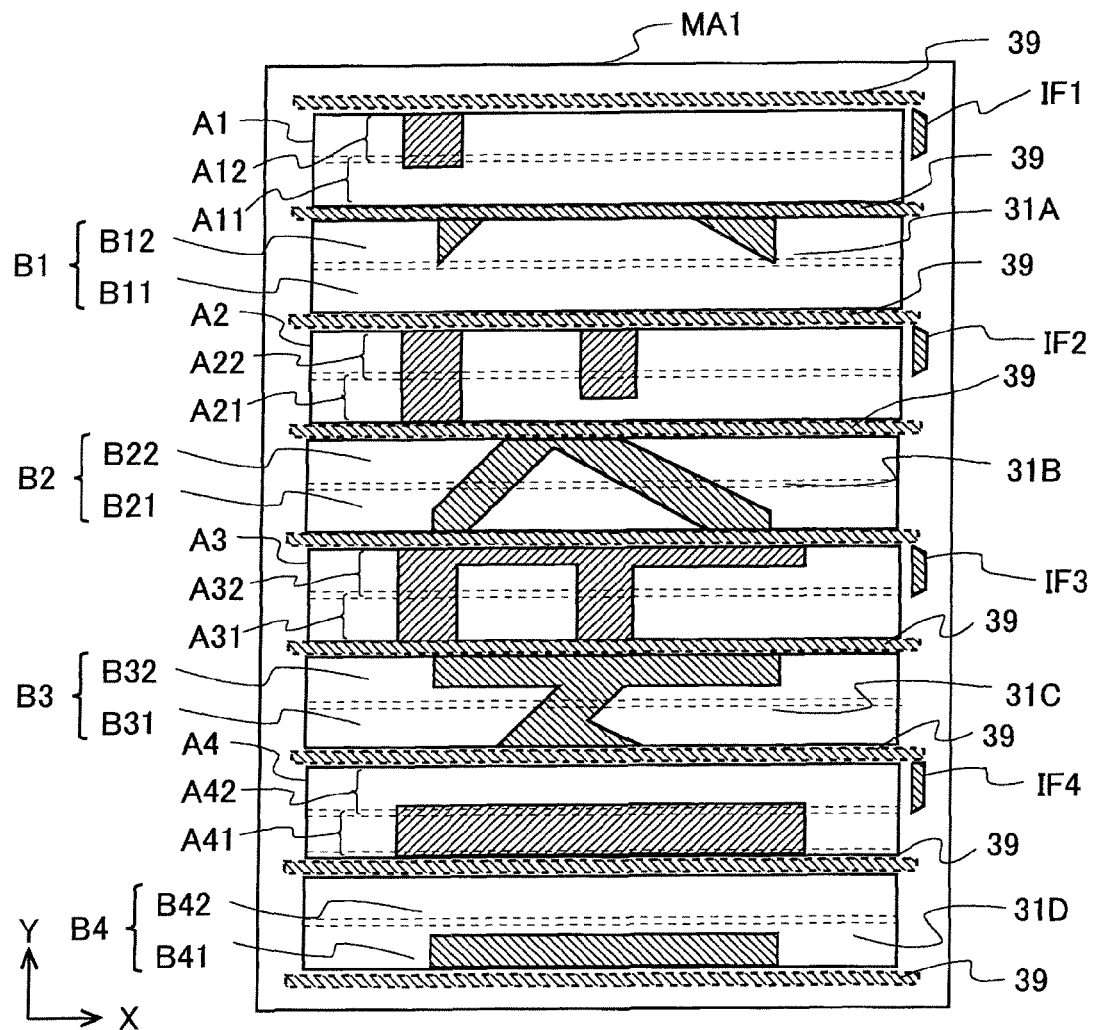
FIG. 13A shows a plan view of a mask of another embodiment.
Figure 13B:
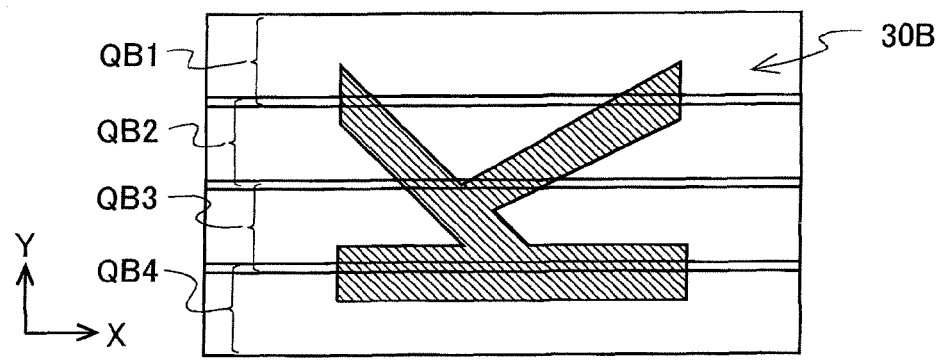
FIG. 13B shows an original device pattern of a part of a mask pattern shown in FIG. 13A.

(7) Namely in the embodiment described above, only the position-measuring marks 32B1, etc. are provided in the inter-pattern areas 31A to 31C of the mask MA. However, for example, as illustrated by a mask MA1 shown in FIG. 13A, another pattern areas B1 to B3 (additional pattern areas) may be provided in the inter-pattern areas 31A to 31C, and a pattern area B4 may be provided on the side in the −Y direction of the pattern area A4. Patterns, which are obtained by reducing partial device patterns QB1 to QB4 of another device pattern 30B indicated by a symbol "K" in FIG. 13B, are formed in the pattern areas B1 to B4. On the pattern surface of the mask MA1, areas which are long in the X direction (scanning direction) and are disposed between the pattern areas A1 to A4 and the pattern areas B1 to B4 of the mask MA1 and areas which are long in the X direction and are disposed outside the pattern areas A1, B4 are holding areas 39 at each of which the mask MA1 is held by the mask stage.

Patterns of the pattern areas B1 to B4 of the mask MA1 are exposed, on the plate PT, while being divided into first partial pattern areas B11 to B41 and second partial pattern areas B12 to B42 as well. In this way, the images of the patterns for the two device patterns can be successively transferred onto the plate by using one sheet of the mask MA1. Accordingly, the patterns for the two device patterns can be quickly transferred without exchanging the mask, thereby making it is possible to improve the throughput in the device production.

The present invention is also applicable even when the magnification of each of the projection optical systems PL1 to PL4 is any one between 1× and 2×.

(8) The two laser interferometers 21XC, 21XD shown in FIG. 2, which are arranged at the interval of the movement amount (interval of the measuring laser beam) brought about when the plate PT is moved in the Y direction in Step 105 and which measure the movement amount in the X direction of the plate PT, are provided on the side of the substrate stage PST. By using these laser interferometers, it is possible to correctly adjust the positions in the X direction of the first divided transfer areas PA11 to PA41 and the second divided transfer areas PA12 to PA42 of the plate PT even if any warpage arises in the movement mirror 51X.

(9) The mask MA shown in FIG. 4 of the embodiment described above is the mask which is formed with the patterns to be projected and exposed onto the plate PT via the plurality of projection optical systems PL1 to PL4 each having the magnifying magnification, the mask MA having the plurality of pattern areas A1 to A4 which are arranged in the mask MA and each of which has the width wider than the width, in the Y direction perpendicular to the X direction, of one of the fields (illumination areas IF1 to IF4) on the side of the object planes of the plurality of projection optical systems PL1 to PL4.

The images of the patterns of the pattern areas A1 to A4 of the mask MA are divided into those of the first partial pattern areas A11 to A41 and the second partial pattern areas A12 to A42 to perform the scanning exposure for the plate PT therewith. Accordingly, it is possible to use the exposure method of the embodiment described above, and it is possible to suppress the occurrence of the stitch error which would be otherwise caused by the drawing error of the mask pattern. It is possible to improve the transfer accuracy of the projected image of the entire mask pattern.

(10) The position-measuring marks 32B1 to 32C2 (positional adjustment marks) are formed in the areas (inter-pattern areas 31A to 31C) between the plurality of pattern areas A1 to A4 in the Y direction. Therefore, the exposure can be performed while highly accurately stitching the images of the patterns of the pattern areas A1 to A4.

(11) As shown in FIG. 5, the pellicles 37A to 37D (protecting members) are individually provided to cover the pattern areas A1 to A4 therewith. Therefore, it is possible to avoid the adhesion of the foreign matter to the pattern areas A1 to A4.

The foregoing embodiment has been explained assuming that the scanning direction and the non-scanning direction of the mask MA and those of the plate PT are coincident with each other in the XYZ coordinate system respectively. However, the scanning direction and the non-scanning direction for each of the mask MA and the plate PT can be defined as different directions in the XYZ coordinate system, corresponding to the construction of the projection optical system forming the projected image of the pattern of the mask MA on the plate PT. However, the scanning direction and the non-scanning direction for the mask MA and the plate PT should be optically coincident with each other, in consideration of the folding or bending, etc. of the optical path in the projection optical system. In this meaning, the phrase "the mask MA and the plate PT are moved synchronously in the scanning direction or the non-scanning direction" means that the mask MA and the plate PT are moved in an optically corresponding direction (optically identical direction) with respect to the projection optical system.

The foregoing embodiment has been explained assuming that the pattern areas A1 to A4 are provided integrally on the mask MA. However, the pattern areas A1 to A4 may be formed on individual masks, and the respective masks may be collectively provided on the mask stage. Those usable as the individual mask include, for example, a small-sized mask in which the mask MA is divided into four corresponding to the pattern areas A1 to A4. In a case that the plurality of masks corresponding to the pattern areas A1 to A4 are collectively provided on the mask stage, it is preferable to provide a mechanism which performs the relative positional adjustment between the respective masks.

Figure 9B:
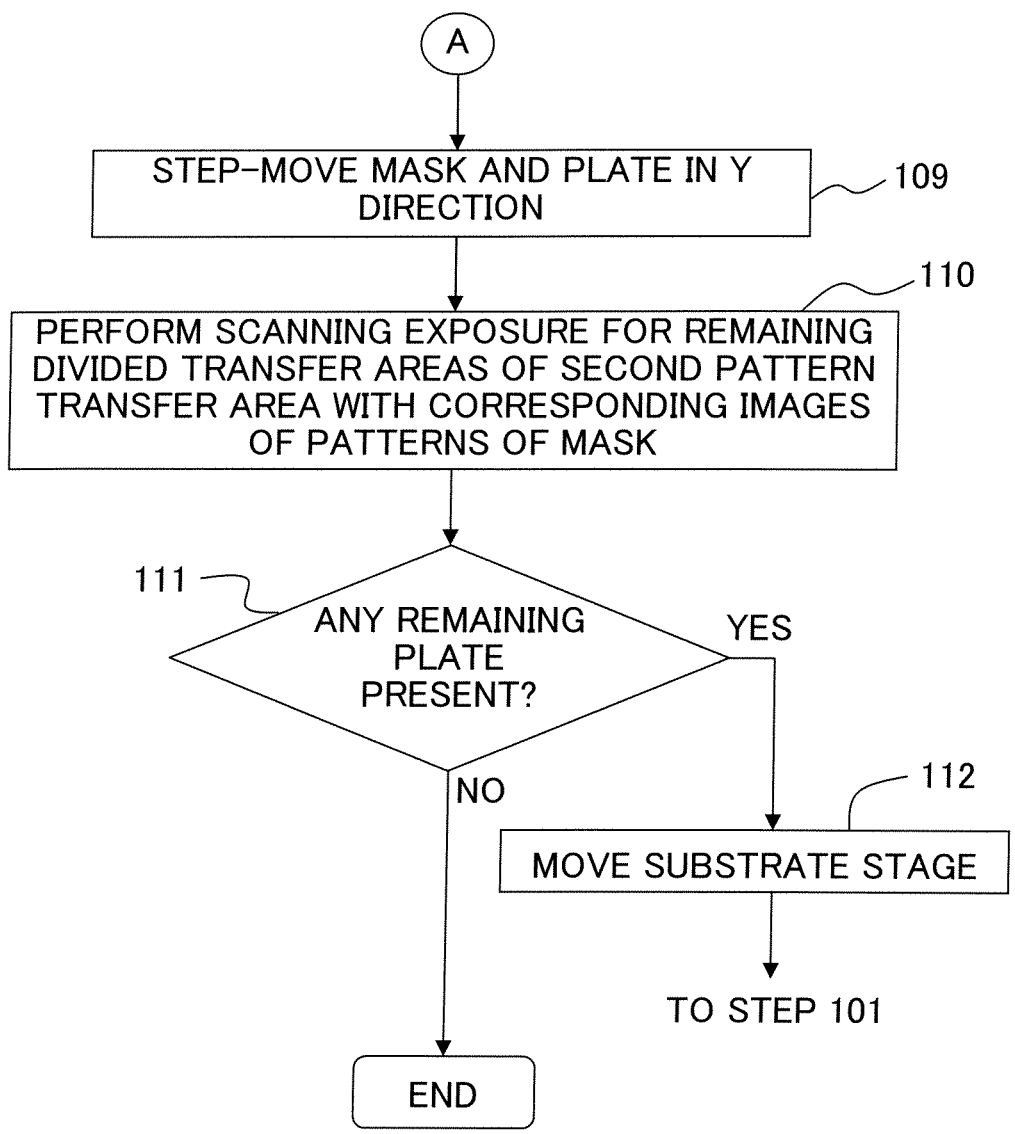
FIG. 9 (9A and 9B) is a flow chart illustrating an example of the exposure operation of the exposure apparatus of the embodiment.

The foregoing embodiment has been explained assuming that the series of processes exemplarily shown in FIGS. 9A and 9B are performed while defining the exposure widths of the exposure areas EF1 to EF4 to have a predetermined size. However, the exposure widths of the exposure areas EF1 to EF4 may be changed for each of the processes. For example, the exposure width may be changed between a case in which the patterns provided in the first partial pattern areas A11 to A41 are transferred and a case in which the patterns provided in the second partial pattern areas A12 to A42 are transferred. By doing so, the widths in the non-scanning direction of the respective pattern areas A1 to A4 and the pattern transfer areas EP1, EP2 can be freely defined within a range of the arrangement interval of the projection optical systems. The exposure width of the exposure area EF1 to EF4 can be changed, for example, by using the variable field diaphragm 8 as described above.

On the other hand, a device such as a liquid crystal display element can be produced by forming a predetermined pattern (a circuit pattern, an electrode pattern, etc.) on a photosensitive substrate (glass plate) by using the exposure apparatus 100 shown in FIG. 2 of the embodiment described above. An explanation will be made below about an example of the production method with reference to a flow chart shown in FIG. 14.

Figure 14:
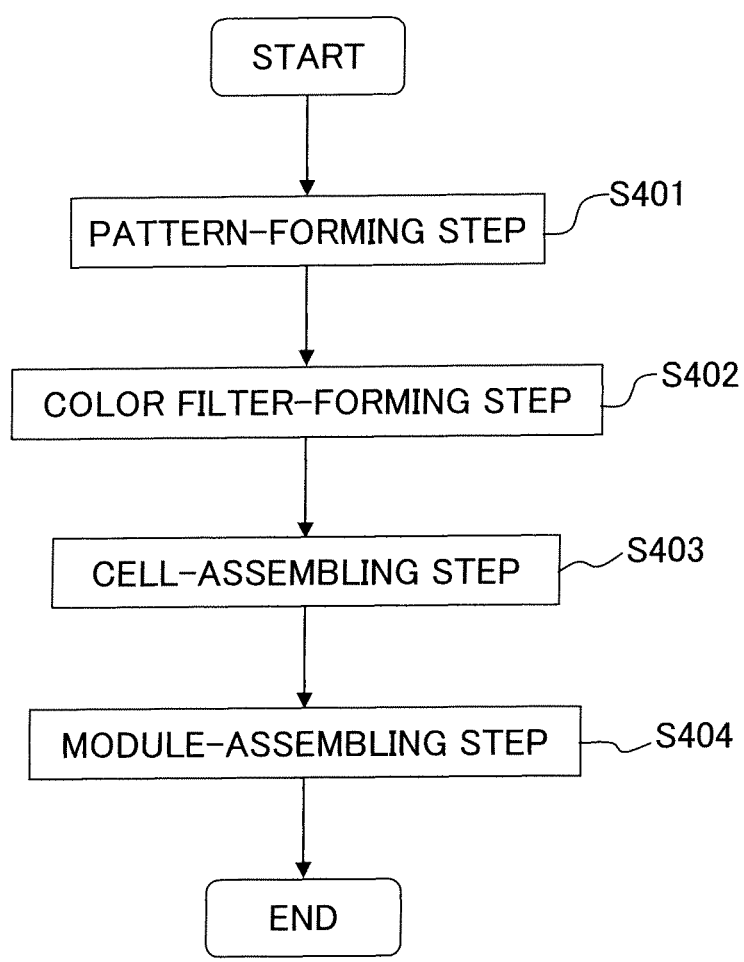
FIG. 14 is a flow chart illustrating an example of steps of producing a liquid crystal display element using the exemplary exposure apparatus of the embodiment.

In Step S401 (pattern-forming step) shown in FIG. 14, at first, a coating step of coating the substrate as the exposure objective with the photoresist to prepare the photosensitive substrate, an exposure step of transferring the pattern of a mask for the liquid crystal display element onto the photosensitive substrate to perform the exposure by using the scanning type projection exposure apparatus described above, and a developing step of developing the photosensitive substrate are executed. A predetermined resist pattern (transfer pattern layer) is formed on the substrate by the lithography step including the coating step, the exposure step, and the developing step. Subsequently to the lithography step, an etching step to use the resist pattern as a mask, a resist exfoliation step, etc. are performed to form a predetermined pattern including a large number of electrodes, etc on the substrate. The lithography step, etc. is executed a plurality of times depending on the number of layers on the substrate.

Subsequently, in Step S402 (color filter-forming step), a color filter is formed by arranging a large number of sets of three minute filters corresponding to the red R, the green G, and the blue B in a matrix form, or by arranging a plurality of sets of three stripe-shaped filters of the red R, the green G, and the blue B in the horizontal scanning line direction. Subsequently, in Step S403 (cell-assembling step), for example, liquid crystal is injected into a space between the substrate having the predetermined pattern obtained in Step S401 and the color filter obtained in Step S402 to produce a liquid crystal panel (liquid crystal cell).

Subsequently, in Step S404 (module-assembling step), parts such as an electric circuit, a backlight for causing the liquid crystal panel (liquid crystal cell) assembled as described above to perform the display operation, etc. are attached, and the liquid crystal display element is completed.

As described above, the foregoing method for producing the liquid crystal display element includes the exposure step of transferring, to the plate (photosensitive substrate), the projected image of the pattern provided on the mask by using the exposure apparatus of the embodiment described above; the developing step of developing the plate to which the projected image has been transferred to form, on the plate, the transfer pattern layer having the shape corresponding to the projected image; and the processing step of processing the plate PT via the transfer pattern layer.

According to the method for producing the liquid crystal display element described above, the influence of the drawing error of the mask pattern is mitigated. Therefore, the liquid crystal display element can be produced highly accurately.

The present invention is not limited to the scanning type exposure apparatus, and is also applicable to such a case that the exposure is performed by a full field type exposure apparatus (stepper type exposure apparatus).

The present invention is not limited to the embodiment described above, and may be embodied in other various forms within a range without deviating from the gist or essential characteristics of the present invention.

What is claimed is:

1. An exposure method comprising:
    a pattern-arranging step of arranging, in a predetermined direction, pattern areas with respect to a plurality of projection optical systems, respectively, which are arranged at an interval and each of which has a magnifying magnification, the pattern areas being formed on a mask substrate and having area widths each of which is smaller than the interval of the projection optical systems and greater than a width obtained by dividing an exposure width of one of the projection optical systems by the magnifying magnification; and
    an exposure step of successively transferring onto a substrate a projected image, projected by an associated projection optical system among the projection optical systems, of a first pattern provided in a first partial pattern area in each of the pattern areas and a projected image, projected by the associated projection optical system, of a second pattern provided in a second partial pattern area in each of the pattern areas, the second partial pattern area having a partial area which is overlaid with the first partial pattern area and other area which is other than the partial area and is different from the first partial pattern area in the predetermined direction in each of the pattern areas, wherein a part of the first pattern and a part of the second pattern are formed on an identical position on the mask substrate, and the part of the first pattern and the part of the second pattern are transferred onto an identical position on the substrate.

2. The exposure method according to claim 1, wherein the exposure step includes:
    a first exposure step of transferring the projected image of the first pattern in each of the pattern areas to a first partial transfer area on the substrate, the first partial transfer area corresponding to the first pattern; and
    a second exposure step of transferring the projected image of the second pattern in each of the pattern areas to a second partial transfer area on the substrate, the second partial transfer area corresponding to the second pattern and having at least a partial area different from the first partial transfer area in the predetermined direction.

3. The exposure method according to claim 1, wherein area boundary portions in the predetermined direction of the first and second partial pattern areas are overlaid with each other at the partial area; and
    an image boundary portion in the predetermined direction of the projected image of the first pattern and an image boundary portion in the predetermined direction of the projected image of the second pattern are transferred while being overlaid in the exposure step.

4. The exposure method according to claim 1, wherein the interval is an integral multiple of the exposure width; and
    in the exposure step, an image end portion in the predetermined direction of the projected image of the second pattern of the pattern provided in a pattern area among the pattern areas is transferred while being overlaid with a projected image, projected by one of the projection optical systems, of the pattern in another pattern area adjacent to the pattern area including the second partial pattern area provided with the second pattern.

5. The exposure method according to claim 1, wherein in the exposure step, the projected image of the first pattern and the projected image of the second pattern are transferred while moving the pattern areas and the substrate in a scanning direction perpendicular to the predetermined direction.

6. The exposure method according to claim 5, wherein in the exposure step, the projected image of the first pattern is transferred while moving the pattern areas and the substrate in a first direction of the scanning direction, and the projected image of the second pattern is transferred while moving the pattern areas and the substrate in a second direction of the scanning direction.

7. The exposure method according to claim 1, wherein the projection optical systems form projected images respectively which are inverted in the predetermined direction; and
    in the exposure step, the pattern areas and the substrate are moved toward mutually opposite sides in the predetermined direction after transferring the projected image of the first pattern and until the projected image of the second pattern is transferred.

8. The exposure method according to claim 1, further comprising:
    an additional pattern-arranging step of arranging, in the predetermined direction, additional pattern areas with respect to the plurality of projection optical systems respectively, each of the additional pattern areas being an additional area provided adjacently to one of the pattern areas and having an area width which is smaller than the interval and greater than the width obtained by dividing the exposure width by the magnifying magnification; and
    an additional pattern exposure step of successively transferring, onto the substrate, a projected image, projected by an associated projection optical system among the projection optical systems, of a first additional pattern provided in a first partial additional pattern area in each of the additional pattern areas and a projected image, projected by the associated projection optical system, of a second additional pattern provided in a second partial additional pattern area in each of the additional pattern areas, the second partial additional pattern area having at least a partial area different from the first partial additional pattern area in the predetermined direction in each of the additional pattern areas.

9. The exposure method according to claim 8, wherein the pattern areas and the additional pattern areas are provided alternately in the predetermined direction on the mask substrate;
the mask substrate is arranged with respect to the plurality of projection optical systems in the pattern-arranging step; and
the mask substrate is moved in the predetermined direction with respect to the plurality of projection optical systems in the additional pattern-arranging step.

10. A method for producing a device, comprising:
an exposure step of successively transferring, by the exposure method as defined in claim 8, onto a photosensitive substrate a projected image of a pattern provided in the pattern areas and a projected image of an additional pattern provided in the additional pattern areas;
a developing step of developing the photosensitive substrate to which at least one of the projected image of the pattern and the projected image of the additional pattern has been transferred to form, on the photosensitive substrate, a transfer pattern layer having a shape corresponding to at least one of the projected image of the pattern and the projected image of the additional pattern; and
a processing step of processing the photosensitive substrate via the transfer pattern layer.

11. The exposure method according to claim 1, wherein the magnifying magnification is at least two-fold.

12. The exposure method according to claim 1, wherein the plurality of projection optical systems is arranged in one array in the predetermined direction.

13. An exposure apparatus comprising:
a plurality of projection optical systems which are arranged at an interval and each of which has a magnifying magnification;
a pattern-arranging mechanism which arranges, in a predetermined direction, pattern areas with respect to the plurality of projection optical systems, respectively and which moves the pattern areas in the predetermined direction, the pattern areas being formed on a mask substrate and having area widths each of which is smaller than the interval of the projection optical systems and greater than a width obtained by dividing an exposure width of one of the projection optical systems by the magnifying magnification;
a substrate-holding mechanism which holds a substrate and which moves the substrate in the predetermined direction; and
a controller which performs control to successively transfer onto the substrate a projected image, projected by an associated projection optical system among the projection optical systems, of a first pattern provided in a first partial pattern area in each of the pattern areas and a projected image, projected by the associated projection optical system, of a second pattern provided in a second partial pattern area in each of the pattern areas, the second partial pattern area having a partial area which is overlaid with the first partial pattern area and other area which is other than the partial area and which is different from the first partial pattern area in the predetermined direction in each of the pattern areas,
wherein a part of the first pattern and a part of the second pattern are formed on an identical position on the mask substrate, and the part of the first pattern and the part of the second pattern are transferred onto an identical position on the substrate.

14. The exposure apparatus according to claim 13, wherein the pattern-arranging mechanism has a pattern holding mechanism which holds an object in which the pattern areas are formed.

15. The exposure apparatus according to claim 14, wherein the pattern areas are formed integrally on the mask substrate; and
the pattern-holding mechanism has a support portion which supports the mask substrate at a portion between adjacent pattern areas among the pattern areas.

16. The exposure apparatus according to claim 13, wherein area boundary portions, of the first and second partial pattern areas, in the predetermined direction are overlaid with each other at the partial area; and
the controller performs control such that the projected image of the first pattern and the projected image of the second pattern are transferred while one image boundary portion in the predetermined direction of the first pattern and one image boundary portion in the predetermined direction of the second pattern are overlaid.

17. The exposure apparatus according to claim 13, wherein the interval is an integral multiple of the exposure width.

18. The exposure apparatus according to claim 17, wherein the controller performs control such that an image end portion, in the predetermined direction, of the projected image of the second pattern provided in a pattern area among the pattern areas is transferred while being overlaid with a projected image, projected by one of the projection optical systems, of the pattern provided in another pattern area adjacent to the pattern area including the second partial pattern area provided with the second pattern.

19. The exposure apparatus according to claim 13, wherein the pattern-arranging mechanism moves the pattern areas in a scanning direction perpendicular to the predetermined direction;
the substrate-holding mechanism moves the substrate in the scanning direction; and
the controller performs control such that the projected image of the first pattern and the projected image of the second pattern are transferred while moving the pattern areas and the substrate in the scanning direction.

20. The exposure apparatus according to claim 19, wherein the projection optical systems form projected images respectively which are inverted in the predetermined direction; and
the controller moves the pattern areas and the substrate toward mutually opposite sides in the predetermined direction after transferring the projected image of the first pattern and until the projected image of the second pattern is transferred.

21. The exposure apparatus according to claim 19, further comprising a plurality of laser interferometers which are arranged in the predetermined direction at an interval equal to the exposure width and which measure an amount of movement of the substrate-holding mechanism in the scanning direction.

22. The exposure apparatus according to claim 13, wherein the pattern-arranging mechanism arranges, in the predetermined direction, additional pattern areas with respect to the plurality of projection optical systems respectively, and the pattern-arranging mechanism moves the additional pattern areas in the predetermined direction, each of the additional pattern areas being an additional area provided adjacently to one of the pattern areas and having an area width which is smaller than the interval and greater than the width obtained by dividing the exposure width by the magnifying magnification; and the controller performs control to successively transfer onto the substrate a projected image, projected by an associated projection optical system among the projection optical systems, of a first additional pattern provided in a first partial additional pattern area in each of the additional pattern areas and a projected image, projected by the associated projection optical system, of a second additional pattern provided in a second partial additional pattern area in each of the additional pattern areas, the second additional partial pattern areas having at least a partial area different from the first partial additional pattern area in the predetermined direction in each of the additional pattern areas.

23. The exposure apparatus according to claim 22, wherein the pattern-arranging mechanism has an additional pattern-holding mechanism which holds an object in which the additional pattern areas are formed.

24. The exposure apparatus according to claim 22, wherein the pattern area and the additional pattern areas are formed integrally on the mask substrate; and the pattern-arranging mechanism has a mask-holding mechanism which holds the mask substrate.

25. The exposure apparatus according to claim 24, wherein the mask-holding mechanism has a support portion which supports the mask substrate at areas between the pattern areas and the additional pattern areas.

26. The exposure apparatus according to claim 13, further comprising a diaphragm mechanism which defines the exposure width variably in the predetermined direction.

27. The exposure apparatus according to claim 13, wherein the magnifying magnification is at least two-fold.

28. The exposure apparatus according to claim 13, wherein the plurality of projection optical systems is arranged in one array in the predetermined direction.

29. A method for producing a device, comprising:

an exposure step of using the exposure apparatus as defined in claim 13 to transfer onto a photosensitive substrate a projected image, projected by the projection optical systems, of a pattern provided in the pattern areas;

a developing step of developing the photosensitive substrate to which the projected image has been transferred to form, on the photosensitive substrate, a transfer pattern layer having a shape corresponding to the projected image; and a processing step of processing the photosensitive substrate via the transfer pattern layer.

30. An exposure apparatus comprising:

a plurality of projection optical systems which are arranged at an interval and each of which has a magnifying magnification;

a pattern-arranging mechanism which arranges, in a predetermined direction, pattern areas with respect to the plurality of projection optical systems, respectively and which moves the pattern areas in the predetermined direction, the pattern areas being formed on a mask substrate and having area widths each of which is smaller than the interval of the projection optical systems and greater than a width obtained by dividing an exposure width of one of the projection optical systems by the magnifying magnification of the one of the projection optical systems;

a substrate-holding mechanism which holds a substrate and which moves the substrate in the predetermined direction; and a controller which performs control to successively transfer onto the substrate a projected image, projected by an associated projection optical system among the projection optical systems, of a first pattern provided in a first partial pattern area in each of the pattern areas and a projected image, projected by the associated projection optical system, of a second pattern provided in a second partial pattern area in each of the pattern areas, the second partial pattern area having at least a partial area different from the first partial pattern area in the predetermined direction in each of the pattern areas;

wherein the controller controls the pattern arranging mechanism to move the pattern areas by less than the widths of the patterns areas in the predetermined direction and the substrate-holding mechanism to move the substrate by the exposure width in the predetermined direction, after the transferring of the first pattern and before the transferring of the second pattern, and a part of the first pattern and a part of the second pattern are formed on an identical position on the mask substrate, and the part of the first pattern and the part of the second pattern are transferred onto an identical position on the substrate.

* * * * *